US009368670B2

(12) United States Patent
Boettcher et al.

(10) Patent No.: US 9,368,670 B2
(45) Date of Patent: Jun. 14, 2016

(54) GAAS THIN FILMS AND METHODS OF MAKING AND USING THE SAME

(71) Applicant: University of Oregon, Eugene, OR (US)

(72) Inventors: Shannon Boettcher, Eugene, OR (US); Andrew Ritenour, Sunnyvale, CA (US); Jason Boucher, Eugene, OR (US); Ann Greenaway, Eugene, OR (US)

(73) Assignee: University of Oregon, Eugene, OR (US)

( * ) Notice: Subject to any disclaimer, the term of this patent is extended or adjusted under 35 U.S.C. 154(b) by 0 days.

(21) Appl. No.: 14/692,421

(22) Filed: Apr. 21, 2015

(65) Prior Publication Data

US 2015/0303347 A1    Oct. 22, 2015

Related U.S. Application Data

(60) Provisional application No. 61/982,271, filed on Apr. 21, 2014.

(51) Int. Cl.
| | |
|---|---|
| H01L 31/18 | (2006.01) |
| H01L 31/0304 | (2006.01) |
| H01L 31/0693 | (2012.01) |
| H01L 21/02 | (2006.01) |
| C30B 29/42 | (2006.01) |
| C30B 23/06 | (2006.01) |

(52) U.S. Cl.
CPC ........ *H01L 31/184* (2013.01); *H01L 31/03042* (2013.01); *H01L 31/0693* (2013.01); *H01L 31/186* (2013.01); *C30B 23/066* (2013.01); *C30B 29/42* (2013.01); *H01L 21/0257* (2013.01); *H01L 21/02546* (2013.01); *H01L 21/02576* (2013.01); *H01L 21/02579* (2013.01); *Y02E 10/50* (2013.01); *Y02P 70/521* (2015.11)

(58) Field of Classification Search
CPC ............ H01L 31/184; H01L 21/02546; H01L 21/0257; H01L 21/02576; H01L 21/02579; C30B 23/066; C30B 29/42
USPC ...................... 438/93, 507; 117/109
See application file for complete search history.

(56) References Cited

U.S. PATENT DOCUMENTS

| | | | | |
|---|---|---|---|---|
| 3,397,094 | A * | 8/1968 | Webb | H01L 21/02425 117/89 |
| 3,607,135 | A * | 9/1971 | Gereth | B01D 3/10 117/84 |
| 3,636,919 | A | 1/1972 | Bozler | |
| 3,945,935 | A * | 3/1976 | Torp | C30B 25/00 204/192.26 |
| 4,434,025 | A * | 2/1984 | Robillard | C30B 23/002 117/103 |

(Continued)

OTHER PUBLICATIONS

Boucher et al., "Homojunction GaAs Solar Cells Grown by Close Space Vapor Transport," Photovoltaic Specialist Conference, Jun. 2014. pp. 0460-0464.

(Continued)

*Primary Examiner* — George Fourson, III
(74) *Attorney, Agent, or Firm* — Klarquist Sparkman, LLP

(57) ABSTRACT

Disclosed herein are embodiments of methods for making GaAs thin films, such as photovoltaic GaAs thin films. The methods disclosed herein utilize sources, precursors, and reagents that do not produce (or require) toxic gas and that are readily available and relatively low in cost. In some embodiments, the methods are readily scalable for industrial applications and can provide GaAs thin films having properties that are at least comparable to or potentially superior to GaAs films obtained from conventional methods.

22 Claims, 15 Drawing Sheets

(56) References Cited

U.S. PATENT DOCUMENTS

| | | | |
|---|---|---|---|
| 4,582,952 | A | 4/1986 | McNeely et al. |
| 4,876,218 | A | 10/1989 | Pessa et al. |
| 5,356,509 | A | 10/1994 | Terranova et al. |
| 5,725,659 | A * | 3/1998 | Sepehry-Fard ......... C30B 1/026 117/109 |

OTHER PUBLICATIONS

Boucher et al., "Towards low-cost high-efficiency GaAs photovoltaics and photoelectrodes grown via vapor transport from a solid source," *Proc. SPIE 8725, Micro- and Nanotechnology Sensors, Systems, and Applications V*, May 30, 2013.

Nicoll, "The Use of Close Spacing in Chemical-Transport Systems for Growing Epitaxial Layers of Semiconductors," *J. Electrochem. Soc.*, 110(11): 1165-1167, Nov. 1963.

Ritenour et al., "Doping and electronic properties of GaAs grown by close-spaced vapor transport from powder sources for scalable III-V photovoltaics," *Energy Environ. Sci.*, 8, 278-285, Sep. 1, 2014.

Ritenour et al., "Efficient n-GaAs Photoelectrodes Grown by Close-Spaced Vapor Transport from a Solid Source," *ACS Appl. Mater. Interfaces*, vol. 4, pp. 69-73, Dec. 3, 2011.

Ritenour et al., "Gallium Arsenide: Vapor Transport Growth and Photoelectrochemical Analysis," Conference presentation presented on Mar. 6, 2014.

Ritenour et al., "Towards High-Efficiency GaAs Thin-Film Solar Cells Grown via Close Space Vapor Transport from a Solid Source," Photovoltaic Specialists Conference, Jun. 2012.

Schmieder et al., "Analysis of Tandem III-V/SiGe Devices Grown on Si," Photovoltaic Specialists Conference, Jun. 2012.

Sotoodeh et al., "Empirical low-field mobility model for III-V compounds applicable in device simulation codes," *Journal of Applied Physics*, 87(6): 2890-2900, Mar. 15, 2000.

* cited by examiner

US 9,368,670 B2

GAAS THIN FILMS AND METHODS OF MAKING AND USING THE SAME

CROSS REFERENCE TO RELATED APPLICATION

This application claims the benefit of U.S. Provisional Patent Application No. 61/982,271, filed on Apr. 21, 2014, the entirety of which is incorporated herein by reference.

ACKNOWLEDGMENT OF GOVERNMENT SUPPORT

This invention was made with government support under contract No. DE-EE0005957 awarded by The United States Department of Energy. The government has certain rights in the invention.

FIELD

The present disclosure concerns methods of making GaAs thin films, including photovoltaic GaAs thin films from low-cost and non-toxic powder precursors.

BACKGROUND

The high balance-of-system costs of photovoltaic (PV) installations indicate that reductions in cell costs per watt alone are likely insufficient for PV electricity to reach grid parity unless energy conversion efficiency is also increased. Technologies that yield high-efficiency cells (e.g., greater than 25%) and maintain low costs are needed. GaAs and related III-V semiconductors are used in the highest-efficiency, single- and multi-junction photovoltaics, but the technology is too expensive for non-concentrated terrestrial applications. This expense is due in part to the inability to modify conventional methods, such as metal-organic chemical vapor deposition (MOCVD), in a manner that can produce commercial/industrial scale products at a low cost. MOCVD uses expensive reactors and uses toxic and pyrophoric gas-phase precursors such as arsine and trimethyl gallium, respectively. There exists a need in the art for methods and devices for making GaAs films having desired electronic properties in a scalable and cost efficient manner.

SUMMARY

Disclosed herein are embodiments of methods for forming a GaAs thin film on a deposition substrate. In some embodiments, the GaAs thin film is made by the steps of providing a GaAs powder source, providing a dopant source, and using vapor transport with a chemical transport agent to deposit the GaAs thin film on the deposition substrate. In some embodiments, the GaAs thin film can have Hall mobilities of 1000-4200 $cm^2V^{-1}s^{-1}$ for an n-type GaAs thin film and/or 50-240 $cm^2V^{-1}s^{-1}$ for a p-type GaAs thin film. In some embodiments, the GaAs thin film is epitaxial. The dopant source can be selected from S, Se, Cd, Ge, Si, C, Te, Zn, or combinations thereof. The chemical transport agent can be selected from $H_2$, $H_2O$, $I_2$, HCl, or combinations thereof. In some embodiments, the vapor transport comprises aqueous vapor transport.

Also disclosed herein are embodiments of methods comprising providing a doped GaAs powder source and depositing a GaAs thin film on a deposition substrate from the doped GaAs powder source using a chemical transport agent in a vapor transport apparatus, the chemical transport agent comprising a carrier gas and $H_2O$, the $H_2O$ concentration being 10 ppm to 12,000 ppm during the deposition. In some embodiments, the GaAs thin film is capable of producing a photocurrent ranging from 15 mA $cm^{-2}$ to 25 mA $cm^{-2}$ under 100 mW $cm^{-2}$ AM 1.5G illumination. The doped GaAs powder can comprise S, Se, Cd, Ge, Si, C, Te, Zn, or combinations thereof. In some embodiments, the GaAs thin film comprises a dopant concentration ranging from $10^{16}$ $cm^{-3}$ to $10^{19}$ $cm^{-3}$. In some embodiments, the GaAs thin film is epitaxial.

Also disclosed herein are embodiments of methods comprising combining a solid GaAs powder with a dopant to form a source composition and depositing a GaAs thin film on a deposition substrate, from the source composition, using a chemical transport agent in a vapor transport system, in the absence of a toxic gas. In some embodiments, the GaAs thin film has an $L_D$ value of 2 μm to 3 μm or 5 μm to 8 μm. The dopant can be selected from S, Se, Cd, Ge, Si, C, Te, Zn, or combinations thereof. The chemical transport agent can be selected from $H_2$, $H_2O$, $I_2$, HCl, and combinations thereof.

Some embodiments concern methods comprising making a GaAs thin film on a deposition substrate using a close-spaced vapor transport system, by providing a source composition comprising GaAs and a dopant powder mixture; maintaining a heat source positioned proximate the source composition, at a temperature ranging from 600° C. to 950° C.; providing the deposition substrate positioned from 0.5 mm to 1.5 mm from the source composition; maintaining the deposition substrate at a temperature that is 5° C. to 200° C. lower than the temperature of the heat source thereby producing a thermal gradient between the source composition and the deposition substrate; exposing the source composition to a chemical transport agent in the close-spaced vapor transport system to produce a vapor-phase GaAs precursor composition; and depositing the GaAs thin film on the deposition substrate using the thermal gradient to facilitate deposition of the vapor-phase GaAs precursor composition. The GaAs thin film can be an epitaxial film. In some embodiments, GaAs thin film is a polycrystalline film. In some embodiments, the source composition is exposed to the chemical transport agent at atmospheric pressure. The chemical transport agent is selected from $H_2$, $H_2O$, $I_2$, HCl, and combinations thereof. In some embodiments, the chemical transport agent is $H_2$ and $H_2O$. The GaAs thin film can be deposited on the deposition substrate at a rate of 10 nm per minute to 10 μm per minute. The dopant can be selected from S, Se, Cd, Ge, Si, C, Te, Zn, or combinations thereof. In particular disclosed embodiments, the dopant is Te powder and/or Zn powder. In some embodiments, the GaAs thin film comprises a dopant concentration ranging from $10^{16}$ $cm^{-3}$ to $10^{19}$ $cm^{-3}$.

BRIEF DESCRIPTION OF THE DRAWINGS

FIG. 6A is a graph of quantum efficiency as a function of applied bias of a p-GaAs thin film measured in non-aqueous I$^-$/I$^{3-}$ under 850 nm illumination provided by a chopped LED; FIG. 6B is a graph of J-E response of a p-GaAs thin film in non-aqueous I$^-$/I$^{3-}$ measured under a solar simulator.

FIG. 20 shows an improved response for the thinner emitter film.

DETAILED DESCRIPTION

I. Explanation of Terms

Figure 1:
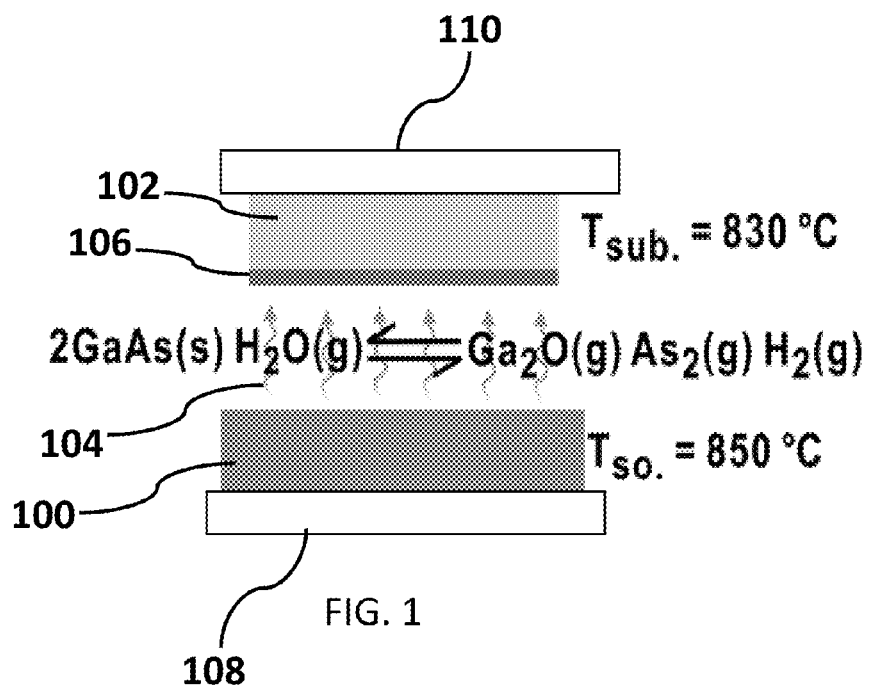
FIG. 1 is a schematic of an exemplary close-spaced vapor transport method.

The following explanations of terms are provided to better describe the present disclosure and to guide those of ordinary skill in the art in the practice of the present disclosure. As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Although the operations of some of the disclosed methods are described in a particular, sequential order for convenient presentation, it should be understood that this manner of description encompasses rearrangement, unless a particular ordering is required or is indicated by specific language. For example, operations described sequentially may in some cases be rearranged or performed concurrently. Moreover, for the sake of simplicity, the attached figures may not show all of the various ways in which the disclosed devices, materials, and methods can be used in conjunction with other devices, materials, and methods. Additionally, the description sometimes uses terms like "produce" and "provide" to describe the disclosed methods. These terms are high-level abstractions of the actual operations that are performed. The actual operations that correspond to these terms may vary depending on the particular implementation and are more fully described herein.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting, unless otherwise indicated. Other features of the disclosure are apparent from the following detailed description and the claims.

Unless otherwise indicated, all numbers expressing quantities of components, molecular weights, percentages, temperatures, times, and so forth, as used in the specification or claims are to be understood as being modified by the term "about." Accordingly, unless otherwise indicated, implicitly or explicitly, the numerical parameters set forth are approximations that can depend on the desired properties sought and/or limits of detection under standard test conditions/ methods, as understood by those of ordinary skill in the art. When directly and explicitly distinguishing embodiments from discussed prior art, the embodiment numbers are not approximates unless the word "about" is recited. In certain embodiments, the term "about" is understood to mean±5%. Furthermore, not all alternatives recited herein are equivalents.

To facilitate review of the various embodiments of the disclosure, the following explanations of specific terms are provided:

Aqueous Vapor Transport: Conversion of one or more solid GaAs sources (and one or more optional solid dopants) to vapor-phase GaAs precursors (and optional vapor-phase dopants) and transportation of the vapor-phase GaAs precursors (and optional vapor-phase dopants), facilitated by water vapor and an optional carrier gas, through the surrounding atmosphere to a deposition substrate where deposition of a GaAs thin film occurs. "Aqueous Vapor Transport," as used herein, does not include metal organic chemical vapor deposition, sputter deposition, chemical vapor deposition, atomic layer deposition, or physical vapor deposition.

Carrier Gas: A gas that is capable of mixing with and facilitating transportation of vapor-phase precursors from one location to a different location.

Chemical Transport Agent: A gas phase chemical capable of forming vapor-phase Ga and As species, such as by oxidation, from a solid GaAs source wherein the Ga and As species have similar vapor pressures and are more volatile (e.g., have vapor pressures greater than $10^{-2}$ Pa) than the solid GaAs source and optional solid dopant. For example, a chemical transport agent converts a solid GaAs powder (or solid compositions comprising GaAs powder and dopant powder(s)) into volatile, vapor-phase gallium, arsenic, and dopant species. Forming the vapor-phase Ga and As species typically includes use of a chemical transport agent in conjunction with heating of the source, as discussed below.

Close-Spaced Vapor Transport: Conversion of a solid GaAs source (and optional solid dopant) to a vapor-phase GaAs precursor (and optional vapor-phase dopant) using a chemical transport agent, and transportation of that vapor-phase GaAs precursor (and optional vapor-phase dopant) from a first location to a deposition substrate that is positioned from 0.5 mm to 1.5 mm from the first location using a temperature gradient between the first location and the deposition substrate, to form a GaAs thin film on the deposition substrate. "Close-Spaced Vapor Transport," as used herein, does not include metal organic chemical vapor deposition, sputter deposition, chemical vapor deposition, atomic layer deposition, or physical vapor deposition.

Epitaxial Film: A crystalline film formed on a deposition substrate, such as a crystalline substrate, wherein the crystalline film comprises a defined crystallographic orientation with respect to the deposition substrate.

GaAs Vapor-Phase Precursor (or Vapor-Phase Precursor Composition): A substance or composition that exists as a vapor and comprises vapor forms of Ga, As, and optionally one or more dopants, and combinations thereof. In some embodiments, a vapor form of Ga can comprise $Ga_2O$ and a vapor form of As can comprise $As_2$.

Photovoltaic Film: A film capable of generating electricity from solar energy (e.g., sunlight).

Polycrystalline Film: A crystalline film comprising crystallites (or grains) of varying sizes and orientation.

Thermal Gradient: A thermal gradient, as used herein, comprises a temperature difference between at least two different locations. Solely by way of example, a thermal gradient can be formed between a first temperature (or a first temperature range) at a first location and a second temperature (or a second temperature range) at a second location wherein the second temperature (or second temperature range) differs from the first temperature (or temperature range), and wherein the temperature incrementally decreases over the distance between the first and second locations. For example, the second temperature range may be 5° C. to 200° C. lower than that of the first temperature (or temperature range).

Thin Film: A film with thickness ranging from 10 nm to 10 µm in thickness, supported on a substrate. In some embodiments the thin film is 10 nm to 1 µm in thickness, in other embodiments the thin film is 10 nm to 50 nm in thickness.

Vapor: A substance that exists in the gas phase at a temperature lower than the substance's critical point and therefore is capable of being condensed to a liquid or deposited as a solid.

Vapor Transport: Conversion of a solid GaAs source (and optional solid dopant) to a vapor-phase GaAs precursor (and optional vapor-phase dopant) using a chemical transport agent at a first location, and transporting the vapor-phase GaAs precursor (and optional vapor-phase dopant) from the first location to a second location to form a GaAs thin film. "Vapor Transport," as used herein, does not include metal organic chemical vapor deposition, sputter deposition, chemical vapor deposition, atomic layer deposition, or physical vapor deposition.

II. Introduction

GaAs is a material of interest for photovoltaic (PV) applications due to its unique properties, such as relatively high carrier mobilities, relatively large optical absorption coefficient $\alpha(\lambda)$, and direct band gap of $E_g=1.42$ eV. These properties can lead to a theoretical maximum one-sun energy conversion efficiency of $\eta=33.5\%$. However, GaAs-containing materials are not currently cost-competitive with conventional Si or CdTe flat-panel photovoltaic materials due in part to the high cost and relatively low throughput of conventional thin film growth techniques. Low-cost, high-throughput (scalable) methods of obtaining GaAs thin films without the use of expensive reagents that produce toxic and/or pyrophoric intermediates therefore are needed in the art.

One conventional method of making GaAs films is metal organic chemical vapor deposition (MOCVD). MOCVD methods, however, are not desirable because they require using gas-phase precursors such as arsine, which is acutely toxic, and trimethylgallium, which is pyrophoric. Using these hazardous and expensive precursors not only is undesirable for commercial methods as they increase cost and worker safety issues, but they further enhance the complexity of the MOCVD reactors required to make the GaAs films. Accordingly, these methods are not suited for making GaAs thin films for terrestrial photovoltaic applications, as such applications require low cost methods and high throughput methods.

Liquid phase epitaxy (LPE) has also been used to make epitaxial GaAs films; however, LPE is a batch process with low throughput compared to that ultimately possible with the methods disclosed herein. Additionally, it is difficult to control and implement heteroepitaxy, particularly on lower cost substrates, such as silicon. Thus, LPE methods have drawbacks that prevent their implementation into large-scale commercial contexts.

The presently disclosed methods for making GaAs thin films, such as photovoltaic GaAs thin films, are scalable methods for making such films—that is, they can be made to operate effectively and reasonably economically on the mass manufacturing scale. Further, the disclosed methods do not require expensive reagents that produce toxic and/or pyrophoric chemical intermediates.

In some embodiments of the present disclosure, vapor deposition methods, aqueous vapor transport, and close-spaced vapor transport methods are described that can be used to make GaAs thin films that exhibit desirable properties for use in electrochemical applications. In some embodiments the methods disclosed herein can be used to make photovoltaic films having physical characteristics and/or electrical properties that are at least comparable to or potentially superior to photovoltaic films formed using conventional techniques; however, the disclosed methods are safer, more cost effective, and easier to use than conventional techniques. Certain embodiments of the methods disclosed herein provide the ability to control the dopant type and dopant density of the GaAs thin films that are made, satisfying a deficiency of conventional methods used to fabricate solid-state photovoltaic devices. Also, certain embodiments of the disclosed methods can produce GaAs thin films possessing relatively high carrier mobilities and $L_D$ values greater than $\alpha(\lambda)^{-1}$.

III. Methods for Making GaAs Thin Films

Disclosed herein are embodiments of methods for making GaAs thin films, such as photovoltaic GaAs thin films. In some embodiments, the disclosed methods can be used to make n- and p-GaAs thin films with a range of free electron concentrations ("$N_D$") and free hole concentrations ("$N_A$"). The GaAs thin films can comprise one or more dopants. Embodiments of the disclosed methods utilize readily available, relatively inexpensive, non-toxic GaAs precursors rather than the expensive reagents that the produce toxic and/or pyrophoric intermediates described above that are used in conventional GaAs film-forming methods, such as MOCVD.

The methods disclosed herein comprise using vapor transport to form the disclosed GaAs thin films. In some embodiments, the methods comprise forming a GaAs thin film on a deposition substrate by providing a GaAs powder source, providing a dopant source, and using vapor transport with a chemical transport agent to deposit on GaAs thin film on the deposition substrate. In such embodiments, the GaAs thin film can have Hall mobilities of 1000-4200 $cm^2V^{-1}s^{-1}$ for an n-type GaAs thin film and/or 50-240 $cm^2V^{-1}s^{-1}$ for a p-type GaAs thin film. In yet additional embodiments, the method does not use (e.g., is free of or is substantially free of) a toxic or pyrophoric gas that is detrimental to worker safety (e.g., arsine and/or trimethylgallium).

The step of providing a solid GaAs source, such as a GaAs powder source, can comprise placing a GaAs powder source within a reactor, placing a GaAs powder source on a support, or both. In some embodiments, the GaAs powder source can be provided as a pellet formed from GaAs powder. Such a pellet can be formed by pressing the GaAs powder source at a pressure suitable to compress the powder into a formed mass. In some embodiments, the pellet can be formed by compressing the GaAs powder source at a pressure of about 34 MPa. Suitable GaAs powder sources can include, but are not limited to, GaAs wafers that have been ground into a powder and elemental Ga and As that have been reacted to form polycrystalline GaAs powder directly.

The step of providing a dopant source can comprise adding one or more dopant sources to the solid GaAs source to form a precursor composition or simply placing the dopant proximate to the solid GaAs source. In some embodiments, the dopant source can be positioned proximate to the solid GaAs source within a reactor or on a support.

Suitable dopant sources include, but are not limited to, sources comprising S, Se, Te, Zn, Cd, Ge, Si, carbon, or combinations thereof. In some embodiments, the dopant source can be a powder and in others the dopant source is in a different solid form. In exemplary embodiments, the dopant can be selected from a sulfur-containing powder, a selenium-containing powder, a tellurium-containing powder, a zinc-containing powder, a cadmium-containing powder, a germanium-containing powder, a silicon-containing powder, or a carbon-containing powder.

The amount of the dopant used in the disclosed methods can range from $10^{16}$ $cm^{-3}$ to $10^{19}$ $cm^{-3}$. In some embodiments, mixed powders can also be used to make related ternary III-V materials such as $GaAs_xP_{1-x}$, wherein x ranges from 0 to 1, such as 0.2 to 0.8, or 0.3 to 0.7, or about 0.3 with a band gap of $E_g$ of 1.8 eV suitable for building two-junction photovoltaic elements on Si.

In particular disclosed embodiments, the vapor transport methods, aqueous vapor transport methods, or close-spaced vapor transport methods can be used to produce GaAs thin films incorporating the same, or substantially the same amount of Ga and As in the deposited GaAs thin film as that of the solid GaAs source. Substantially the same, in this context, means that the amount of the Ga and As incorporated into the deposited GaAs thin film is 80% to 99% of the amount present in the solid GaAs source, such as 85% to 99%, or 90% 99%, or 95% to 99%. In an exemplary embodiment, 95% GaAs transport/utilization efficiency from source to substrate was obtained.

In some embodiments, vapor transport is used to form a GaAs thin film from the solid GaAs source and optionally, the dopant source, onto a deposition substrate. That is, the Ga and As components of the source are vaporized, transported to a deposition substrate and a thin film of GaAs is formed on a surface of the deposition substrate. A chemical transport agent facilitates the formation of the GaAs thin film on the deposition substrate by reacting with the GaAs powder source to form Ga and/or As species that are sufficiently volatile so as to be transported through the surrounding atmosphere. A temperature gradient aids in condensing the vapors onto the deposition substrate forming the GaAs thin film thereon.

The chemical transport agent can be selected from, but is not limited to the following gases or vapor forms, $H_2$, $I_2$, HCl, $H_2O$, or combinations thereof. Thus, in some embodiments, the chemical transport agents can be selected from $H_2$, $H_2O$, $I_2$, HCl vapors, or combinations thereof. In some embodiments, the chemical transport agent can be used in combination with a carrier gas. In exemplary embodiments, the carrier gas and chemical transport agent are a combination of $H_2$ and $H_2O$ vapor. This chemical transport agent, or other chemical transport agents comprising water vapor can be used in aqueous vapor transport. In such embodiments, the $H_2O$ concentration in the carrier gas can range from 10 ppm to 12,000 ppm, such as 25 ppm to 10,000 ppm, or 50 ppm to 5,000 ppm, or 100 ppm to 2,500 ppm, or 500 ppm to 2,000 ppm, or 1,000 ppm to 1,500 ppm.

In particular disclosed embodiments, vapor transport comprises utilizing a combination of differing temperature regions to produce a thermal gradient by which vapor-phase Ga and As species, which are produced from interaction of the GaAs powder source with the chemical transport agent, is transported from a first location to a second location. In some embodiments, the thermal gradient comprises at least two temperatures (or temperature ranges), such as a first temperature and a second temperature. The first and second temperature ranges can be produced by a suitable heat source as known to those of ordinary skill in the art, such as a graphite resistive heater, IR heat sources, and/or inductive heaters. In some embodiments, the first temperature at a first location is such that it can heat the GaAs source (alone or in combination with a dopant) to a temperature sufficient to vaporize the GaAs source (alone or in combination with a dopant). In some embodiments, a combination of the chemical transport agent and the heat source increases the vapor pressure of the Ga and As species to thereby facilitate vaporization of the GaAs source. In many embodiments, the chemical transport agent operates in conjunction with the raising of the temperature of the source to create the vapor-phase Ga and As species. In certain embodiments, both the chemical transport agent and the raising of the source temperature above solid phase temperatures are needed to act in conjunction and create some synergy therebetween to further facilitate vapor formation. The second temperature at a second location is lower than the first temperature such that the vapor pressure of the vaporized GaAs source is lower on the deposition substrate. In some embodiments, the first and second temperatures have a difference in temperature of from 5° C. to 200° C. In some embodiments, the combination of reaction temperatures comprises a first temperature range and a second temperature range. The first temperature range typically is selected to be higher than the second temperature range. In some embodiments, the first temperature range can include temperatures ranging from 600° C. to 950° C., such as 700° C. to 900° C., or 750° C. to 850° C., or 800° C. to 850° C. The second temperature range typically includes temperatures that are from 5° C. to 200° C. lower than the first temperature range. As the Ga and As vapors are exposed to the cooler atmosphere of the second temperature, the vapors condense to form a thin film on the deposition substrate.

The vapor transport methods do not comprise, or are other than, methods using metal organic chemical vapor deposition, sputter deposition, chemical vapor deposition, atomic layer deposition, or physical vapor deposition. In exemplary embodiments, the method can include using aqueous vapor transport and/or close-spaced vapor transport.

In some embodiments, the methods comprise close-spaced vapor transport. In close-spaced vapor transport methods, GaAs thin films can be made by providing a solid GaAs source and an optional dopant and using a chemical transport agent and a close-spaced vapor transport apparatus to convert the solid GaAs source and optional dopant into vapor-phase precursors. The vapor-phase precursors are transported through the atmosphere of the close-spaced vapor transport apparatus to a deposition substrate positioned at a particular distance from the solid GaAs source. A thermal gradient is used to facilitate the transport of the vapor-phase precursors and deposition of the GaAs thin film onto the deposition substrate.

In some embodiments of close-spaced vapor transport, GaAs thin films can be formed on a deposition substrate by providing a source composition comprising a GaAs powder source, a dopant, or a mixture thereof; maintaining a first heat source, positioned proximate the GaAs powder source, at a first temperature ranging from 600° C. to 950° C.; providing a deposition substrate positioned from 0.5 mm to 1.5 mm from the GaAs powder source; maintaining a second heat source positioned proximate to the deposition substrate, at a temperature that is from 5° C. to 200° C. lower than the first temperature of the first heat source thereby producing a thermal gradient between the GaAs powder source location and the deposition substrate; exposing the source composition to a chemical transport agent in the close-spaced vapor transport apparatus to produce a vapor-phase GaAs precursor composition; and depositing GaAs to form a thin film on the deposition substrate using the thermal gradient to facilitate deposition of the vapor-phase GaAs precursor.

A schematic diagram of an exemplary close-spaced vapor transport method is illustrated in FIG. 1. As illustrated in FIG. 1, a GaAs source 100 is provided and a first heat source 108 positioned proximate to the GaAs source is maintained at a temperature of 850° C. A second heat source 110 positioned proximate to substrate 102 is positioned from 0.5 mm to 1.5 mm away from the GaAs source 100. Substrate 102 is maintained at a lower temperature of 830° C. using the second heat source 110. As the vapor-phase GaAs precursor composition is produced (illustrated as arrows 104), GaAs is deposited on substrate 102 as a thin film 106.

In particular disclosed embodiments, the close-spaced vapor transport methods described herein can be used to deposit GaAs thin films on the deposition substrate at a rate of 10 nm per minute to 10 μm per minute, such as 0.1 μm to 6 μm per minute, or 1 μm to 6 μm per minute.

A close-spaced vapor transport apparatus can comprise a reaction chamber to house one or more deposition substrates, one or more heat sources, and an optional powder source support. In some embodiments, the deposition substrate is the substrate upon which GaAs thin films are deposited. In some embodiments, a powder source support can be used upon which a GaAs powder source, a dopant source, or a doped GaAs source composition can be placed. In yet other embodiments, the support need not be used. The deposition substrate is positioned at a selected distance away from the powder source support, if used. In other embodiments, the deposition substrate can be positioned at a selected distance away from the GaAs powder source, the dopant source, or a doped GaAs source composition. In some embodiments, the deposition substrate is placed from 0.5 mm to 1.5 mm, or 0.5 mm to 1 mm, or 0.5 mm to 0.75 mm from the powder source.

In some embodiments, the close-spaced vapor transport apparatus further comprises a spacer, such as a quartz spacer. The spacer can be positioned between the deposition substrate and the support (or the GaAs powder source if a support is not used), the dopant source, or a doped GaAs source composition. The spacer can be used to separate the deposition substrate from the source and/or the support and further can be used to confine the vapor-phase precursors in the space between the deposition substrate and the source and/or support. In some embodiments, the spacer can have a thickness ranging from 0.5 mm to 1.5 mm, or 0.5 mm to 1 mm, or 0.5 mm to 0.75 mm. In exemplary embodiments, the spacer thickness ranges from 0.7 mm to 0.9 mm.

The chemical transport agent can be delivered into the close-spaced vapor transport device such that it flows over the GaAs powder source, the dopant source, or a doped GaAs source composition.

Figure 2:
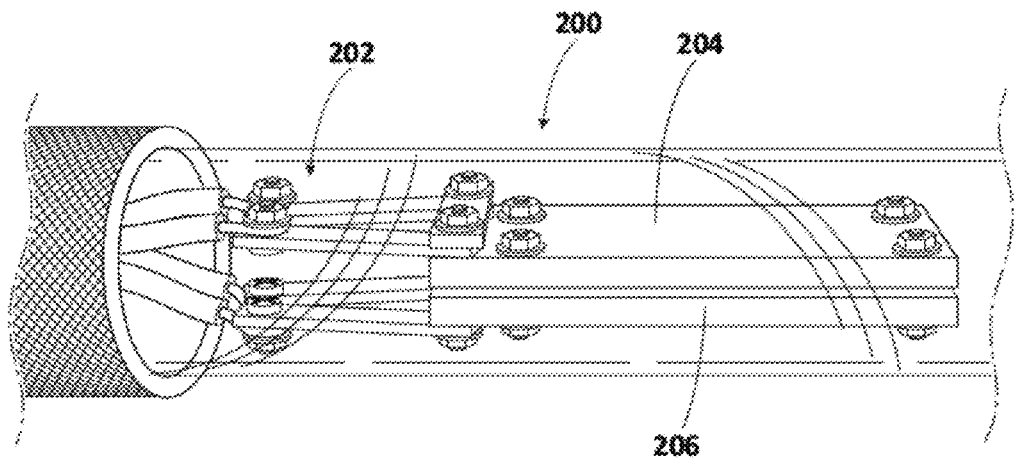
FIG. 2 is an illustration of an exemplary close-spaced vapor transport apparatus.

FIG. 2 shows an exemplary close-spaced vapor transport apparatus 200. As illustrated in FIG. 2, a glass reaction chamber 202 is provided that encloses a deposition substrate (not illustrated) and a support (not illustrated) and the first and second heat sources 204 and 206, respectively. Though not illustrated in FIG. 1, the GaAs powder source, the dopant source, or a doped GaAs source composition can be positioned on top of the support and further positioned to face the deposition substrate. The first and second heat sources 204 and 206, respectively, can be used to provide heat at different temperatures to the support and the deposition substrate to provide a thermal gradient from the support to the deposition substrate. The chemical transport agent can be introduced into the CSVT apparatus 200 via a suitable opening and allowed to pass between heat sources 204 and 206.

GaAs thin films made using the methods described herein exhibit certain properties facilitating their use in a variety of different applications and devices. The GaAs thin films formed using the methods disclosed herein can be epitaxial or polycrystalline. In some embodiments, the GaAs thin films are used as photovoltaic GaAs thin films that can be used for solar energy conversion, particularly as solar cells. Solar cells made with the GaAs thin films can comprise pn-junctions. The pn-junctions can be made with the GaAs thin films produced by the methods described herein by fabricating front contact grids using photolithography or evaporation of metal through a shadow mask. Ohmic contact can be made by sequentially evaporating Ni/AuGe in the presence of the GaAs thin film and annealing under forming gas. Patterns can be made in the GaAs thin film using a photoresist and etching the GaAs thin film using a suitable etching formulation (e.g., an acid, such as citric acid; and a peroxide, such as hydrogen peroxide). Back contacts can then be formed by applying InGa eutectic with a scribe or via deposition of Au/Zn followed by annealing under forming gas.

The vapor transport methods of the present disclosure can be used to make GaAs thin films (and solar cells comprising such films) that exhibit physical and electrochemical characteristics that are at least comparable to or potentially superior to those exhibited by GaAs thin films made using the conventional methods described herein. In some embodiments, the methods can be used to produce GaAs thin films that have minority carrier diffusion lengths ($L_D$) of up to 3 μm for n-GaAs thin films and up to 8 μm for p-GaAs thin films. The $L_D$ can be determined by analyzing the internal quantum efficiency $\phi_{int}$ and electron beam induced current (EBIC). The lengths obtained using the disclosed methods are long with respect to $\alpha(\lambda)^{-1}$ and consistent with the measured one-sun photocurrents in a photoelectrochemical (PEC) configuration (e.g., at least greater than or potentially superior to 20 mA $cm^{-2}$ with no antireflective coating). Hall mobilities obtained using the n- and p-GaAs thin films made using the disclosed methods can approach the ionized dopant scattering limit and are comparable to what has been achieved using conventional methods, such as MOCVD. For example, in some embodiments, Hall mobilities of 1000-4200 $cm^2V^{-1}s^{-1}$ for n-type GaAs thin films and/or 50-240 $cm^2V^{-1}s^{-1}$ for p-type GaAs thin films can be obtained. Additionally, the disclosed methods can be used to make GaAs thin films capable of producing photocurrents of 15 mA $cm^{-2}$ to 25 mA $cm^{-2}$ under 100 mW $cm^{-2}$ AM 1.5G illumination.

Conventional methods using commercial GaAs wafers having zinc concentrations of less than $2\times10^{19}$ $cm^{-3}$ result in setting an upper limit of $N_A \approx 2\times10^{17}$ $cm^{-3}$ for films grown from such commercially available sources. This is problematic since some active photovoltaic device components (e.g., emitters and back surface fields) require $N_A$ values greater than $2\times10^{17}$ $cm^{-3}$. Thus, in one exemplary embodiment of the presently disclosed methods, zinc powder was used as a p-type dopant to grow p-GaAs thin films with higher $N_A$. A GaAs source powder and the zinc powder were combined to form a source composition, which was pressed into a 13 mm pellet die at 34 MPa. The pelleted source composition was used to make a p-GaAs thin film with $N_A$ up to $2\times10^{19}$ $cm^{-3}$ (see Table 1 in the examples section).

Figure 3:
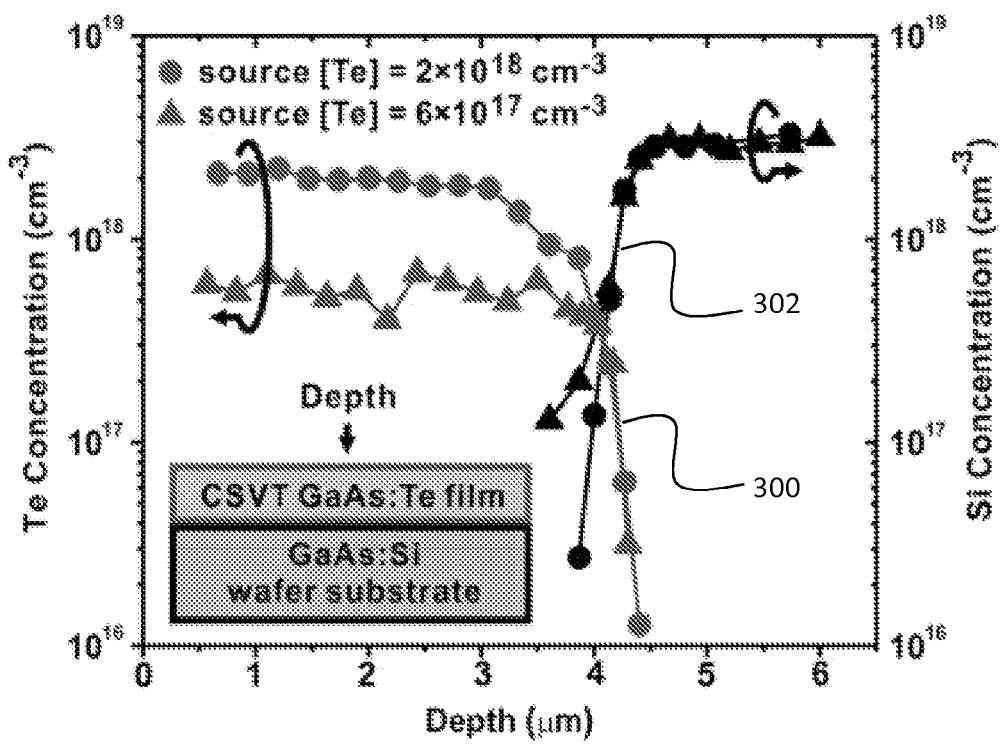
FIG. 3 is a graph of SIMS depth profiles of two exemplary n-GaAs thin films grown from differently-doped GaAs:Te sources on GaAs:Si substrates; the Te depth profiles (indicated as line 300) and Si depth profiles (indicated as line 302) are shown, wherein circles denote the film was grown from a source containing [Te]=$2\times10^{18}$ $cm^{-3}$ and triangles denote the film was grown from a source with [Te]=$6\times10^{17}$ $cm^{-3}$.

In another exemplary embodiment, an n-type dopant was used to control No. The exemplary n-type dopant used in this exemplary embodiment was tellurium. N-GaAs:Te sources with different Te concentrations were used to grow GaAs thin films. In exemplary embodiments, the n-GaAs:Te sources with different Te concentrations were grown on degenerately-doped GaAs:Si substrates. In one exemplary embodiment, a n-GaAs:Te film was deposited on an undoped, semi-insulating substrate. This embodiment was used to confirm that the dopants were transported by the close-spaced vapor transport apparatus/method and not diffused from the substrate itself. Hall Effect measurements of exemplary GaAs thin films confirmed that $N_D$ of the film was proportional to the source concentration of Te. In additional embodiments, TOF-SIMS was used to evaluate the films. Exemplary films possessed Te concentrations similar to the source's Te concentration and contain no Si from the GaAs:Si substrate (FIG. 3 and Table 1).

The results described herein demonstrate that inexpensive solid GaAs sources can be used to deposit GaAs thin films suitable for high performance III-V based PV devices at high growth rate, with ~95% GaAs utilization, and at ambient pressures using a cost-efficient apparatus.

IV. Products Made with Photovoltaic Films

Embodiments of the methods disclosed herein can be used to produce photovoltaic films for high-efficiency GaAs PV devices. The disclosed methods provide the ability to control both $N_A$ and $N_D$ while maintaining suitable electronic quality of the GaAs layers. In some embodiments, methods are disclosed for analyzing the films made using methods described herein, such as determining which dopants are transported by CSVT, how the source dopant concentration is related to the film dopant concentration, and/or how the dopants affect the electronic quality of the layers.

Some conventional techniques for forming photovoltaic films result in undesirable sulfur impurities that can occur from unintentional S-doping of GaAs layers. This unintentional sulfur impurity is undesirable since it is a compensating defect in p-GaAs films. In some embodiments, the methods disclosed herein are able to avoid undesirable S-doping. In some embodiments, heat sources free of contaminants, such as sulfur, are used so as to decrease or substantially eliminate the unintentional S-doping of the films. In some embodiments, the disclosed methods can result in a decrease of S-doping such that the sulfur concentration is less than or equal to $7\times10^{16}$ $cm^{-3}$, as determined by TOF-SIMS analysis of the films. In some embodiments, the sulfur concentration can be further reduced or substantially eliminated by using non-porous, higher-purity heat source materials; however, the disclosed methods are capable of producing films having sufficiently low sulfur concentrations to permit growth of p-GaAs thin films with $N_A \geq 10^{17}$ $cm^{-3}$, without having to utilize such high-purity heat source materials. P-GaAs thin films with such values are appropriate for use as a p-type absorbing layer in a photovoltaic device.

In yet additional embodiments, a PEC GaAs|electrolyte junction can be used as an analysis technique to enable studying the material properties, such as photocurrent versus potential (J-E) response, impedance spectroscopy, and $\phi_{int}$ of films formed using the methods disclosed herein without having to fabricate solid state devices. Such techniques are described in the Examples section below.

V. Examples

GaAs Thin Film Deposition

In this example, the carrier gas for CSVT was $H_2$ (Industrial Source, 99.999%) with a water concentration [$H_2O$] of 2,000 ppm. The water concentrate was controlled by combining a stream of dry $H_2$ with a stream of $H_2O$-saturated (dew point 10° C.) H$_2$ using mass flow controllers (SEC 4400) and monitored with a Panametrics MM4 Hygrometer. PID controllers (Omega CN7800) were used to set the growth temperature to 850° C. and 830° C. for the source and substrate, respectively, (see in FIG. 1). The temperature was monitored using type K thermocouples embedded in the resistive graphite heaters. A quartz ring 12 mm in diameter and 0.8 mm thick was used as a spacer between the source and substrate. The film thicknesses of all PEC samples were 5-11 µm (measurements obtained from a Zygo 7300 optical profilometer), ensuring all light was absorbed in the CSVT GaAs thin film rather than the substrate. The growth rate (which depends on [H$_2$O] used during growth) was ~0.3 µm/min. Single-crystal <100>-oriented GaAs wafers grown by the vertical gradient freeze technique (AXT, Inc.) were used as substrates. The substrates were epi-ready as received and cleaned by blowing with N$_2$.

Powder GaAs sources were obtained by grinding undoped GaAs wafers (AXT) in an agate mortar and pestle and pressing at 34 MPa in a 13 mm pellet die. The mortar and pestle were cleaned by submersing in aqua regia and rinsing with 18.2 MΩ·cm water. Zn powders were separately weighed and combined with the GaAs powder prior to pressing. Te-doped powders with [Te]<10$^{19}$ cm$^{-3}$ were made by grinding and pressing Te-doped wafers. A source pellet containing [Te]=10$^{19}$ cm$^{-3}$ was made by combining undoped GaAs and Te powder. Single-crystal wafers were also used as sources to provide a comparison to the powders. These were cut into 13×13 mm squares and cleaned by blowing with N$_2$.

Photoelectrochemical Measurements

Electrodes were fabricated using procedures described by A. J. Ritenour, R. C. Cramer, S. Levinrad and S. W. Boettcher, *ACS Appl. Mater. Interfaces*, 2012, 4, 69-73, the relevant portion (i.e., electrode fabrication methods) of which is incorporated herein by reference. Ohmic contacts were formed on the back of the substrates by thermal evaporation of Au/Zn/Au (20 nm, 30 nm, 50 nm) for p-GaAs or AuGe eutectic (100 nm) for n-GaAs. Contacts were annealed at 450° C. for 2 min in 95% N$_2$/5% H$_2$. Ohmic contacts were connected to Sn—Cu wire with conductive Ag adhesive (Pelco 16040-30) and attached to 6 mm diameter glass tubes with non-conductive epoxy (Hysol 1C). A circular electrode active region (~0.05 cm$^2$) was defined using non-conductive black epoxy (Hysol 9460).

Rectifying contacts to n-GaAs for current-voltage (J-E) measurements, impedance measurements, and spectral response measurements were obtained using an electrolyte consisting of 1 M LiClO$_4$ (Alfa-Aesar, 99%, anhydrous), 100 mM ferrocene (Aldrich, 98%, sublimed before use), and 0.5 mM ferrocenium tetrafluoroborate (obtained by oxidizing ferrocene with benzoquinone in the presence of HBF$_4$, recrystallizing in tetrahydrofuran, and drying under vacuum) in dry acetonitrile (Acros, 99.8%, distilled and dried with freshly-activated 3 Å molecular sieves). For spectral response measurements, the solution was diluted 1:10 with dry acetonitrile to reduce parasitic solution absorbance.

For one-sun J-E measurements of p-GaAs, an aqueous solution of 1 M HI (Aldrich, 99.99%) and 0.125 M I$_2$ (Alfa-Aesar, 99.8+%) was used. For spectral response and impedance of p-GaAs a non-aqueous electrolyte consisting of 0.1 M NaI (Alfa-Aesar, 99+%, anhydrous), 0.0125 M I$_2$ (Sigma-Aldrich 99.99%, sublimed), and 0.1 M LiClO$_4$ in dry acetonitrile was used.

For all PEC measurements a potentiostat (Bio-Logic SP-200) in three-electrode configuration was used. The GaAs electrode potential (E) was referenced to the potential of a Pt wire poised at the solution potential (E$_{sol}$) and a Pt mesh was used as the counter electrode. The three electrodes were held in a glass three-neck flask containing the appropriate electrolyte with the GaAs electrode<1 mm from the bottom surface. Mass transport was aided by a magnetic stirrer. Illumination was provided by a solar simulator (Abet Technologies model 10500) for J-E experiments. The light intensity incident on the front face of the glass cell was 100 mW cm$^{-2}$ as determined using a calibrated photodiode (OSI Optoelectronics UV-005). The photodiode was calibrating using an optical pyrometer (Thor Labs S310C).

Figure 4:
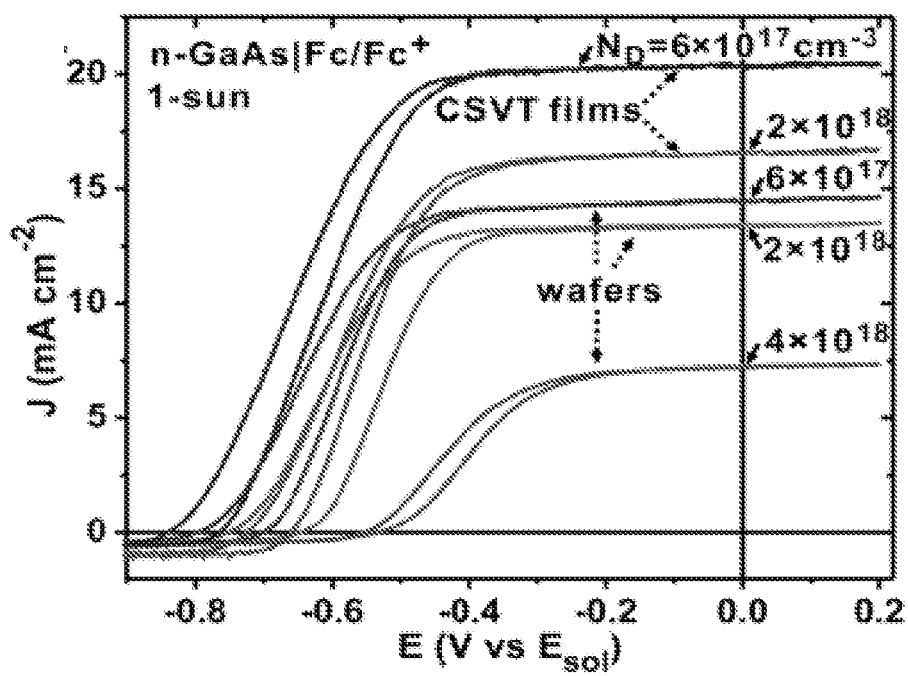
FIG. 4 is a graph of photoelectrochemical J-E curves of n-GaAs thin films and control wafers; the curves are labeled with the corresponding sample's free carrier concentration (in $cm^{-3}$) and selected curves are representative of other electrodes obtained from the same samples and from other samples with similar free carrier concentrations.

Electrodes of CSVT n-GaAs thin films were immersed in a non-aqueous ferrocene/ferrocenium electrolyte (Fc/Fc$^+$) and their J-E response was measured under 100 mW cm$^{-2}$ of simulated AM1.5G irradiation. Commercial <100>-oriented single-crystal wafers were measured as controls. The CSVT samples produced open-circuit voltages (V$_{oc}$) up to 0.83 V, equivalent to that attained by others using MOCVD n-GaAs. Short-circuit current density (J$_{sc}$) was ~20 mA cm$^{-2}$ for moderately-doped samples having N$_D$=10$^{16}$~10$^{17}$ cm$^{-3}$. The performance of all samples exceeded the respective bare substrates and similarly-doped GaAs control wafers (FIG. 4). There were no significant differences between films grown from powder and wafer sources. Lower photocurrent was observed in highly-doped samples, which also exhibited lower µ$_h$ (and consequently L$_D$) due to carrier scattering by ionized dopant atoms in the lattice (see Hall Effect measurements below).

Figure 5:
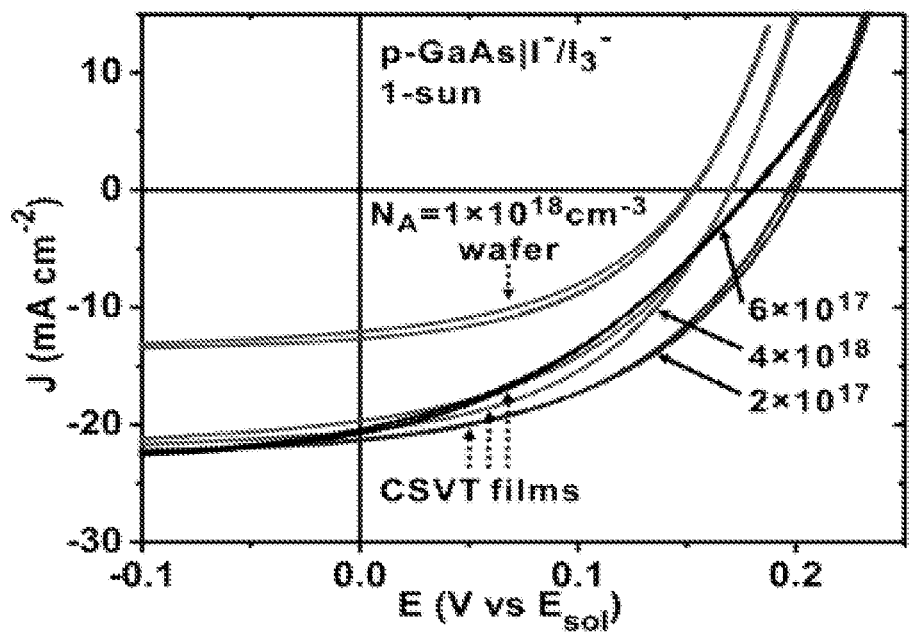
FIG. 5 is a graph of photoelectrochemical J-E curves of p-GaAs thin films and control wafers; the curves are labeled with the corresponding sample's free carrier concentration (in cm$^{-3}$) and selected curves are representative of other electrodes obtained from the same samples and from other samples with similar free carrier concentrations.

Electrodes of CSVT p-GaAs thin films and control wafers were immersed in an aq. iodide/triiodide electrolyte (I$^-$/I$_3^-$) and their J-E response was measured under 100 mW cm$^{-2}$ of simulated AM1.5G irradiation (FIG. 5). The V$_{oc}$ was 0.15-0.20 V vs E$_{sol}$, lower than the n-GaAs samples due to surface pinning of the p-GaAs Fermi level near the valence band edge. Certain samples exhibited J$_{sc}$~20 mA cm$^{-2}$, similar to the n-GaAs samples despite the higher parasitic light absorption of the I$^-$/I$^{3-}$ electrolyte. All CSVT p-GaAs thin films (including those synthesized with N$_A$>10$^{18}$ cm$^{-3}$) exhibited higher photocurrent than the p-GaAs control wafer (N$_A$=1×10$^{18}$ cm$^{-3}$, J$_{sc}$=12 mA cm$^{-2}$) indicating lower bulk recombination and a longer L$_D$.

Spectral Response

Figure 6A:
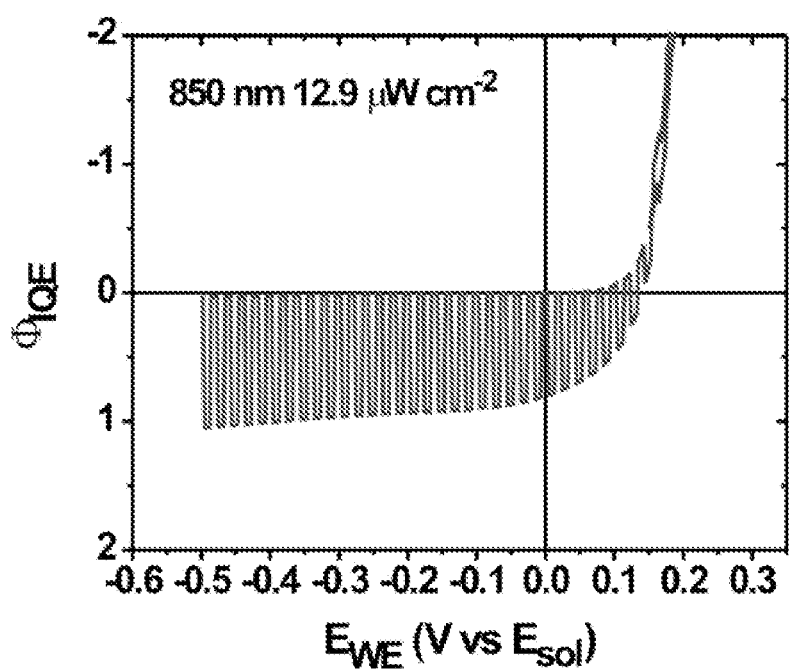
FIGS. 6A and 6B are graphs illustrating results obtained from analysis of a representative p-GaAs thin film.
Figure 6B:
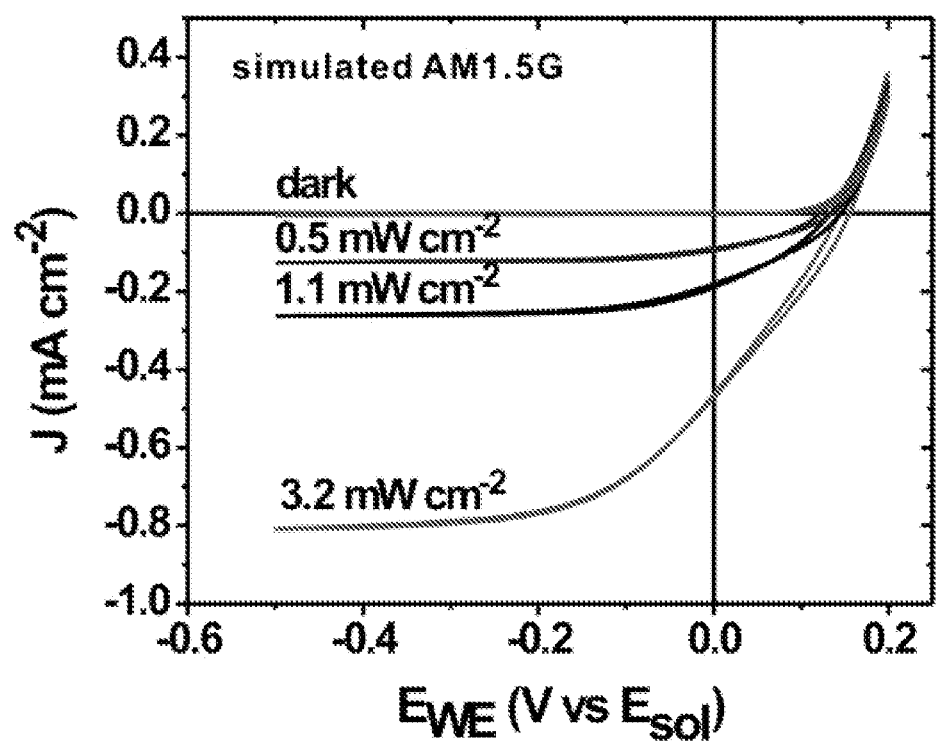

Spectral response of the PEC cells was measured using a Bentham PVE300 system. The monochromatic light was chopped at 35 Hz and the nA-range signal was measured using a lock-in amplifier. The chopped signal was free of transients and the amplitude of the signal was independent of chopping frequency from 10-50 Hz. A calibrated photodiode (Bentham 11677) was used to determine the incident light intensity so that the nA signal could be converted to external quantum efficiency (ϕ$_{ext}$). The chopped photocurrent scaled linearly with the incident light intensity over five orders of magnitude (FIGS. 6A and 6B).

Reflectance, R(λ), of the air|glass|acetonitrile|GaAs stack was measured using a spectrometer with an integrating sphere (Perkin Elmer Lambda 1050). This data was used to obtain ϕ$_{int}$ from ϕ$_{ext}$=ϕ$_{int}$[1−R(λ)]. Although films from wafer sources were not completely specular, all films possessed R(λ) equivalent to a polished single-crystal GaAs wafer when measured in the integrating sphere. Therefore, although some of the films exhibited diffuse reflectance, the total R(λ) was unchanged. All films grown from powder sources were specular.

To determine the L$_D$ for each sample, the spectral response was measured using the short-circuit PEC configuration (E$_{WE}$=0 V vs E$_{sol}$) under low-intensity chopped monochromatic light. For the n-GaAs thin films such measurements in the Fc/Fc$^+$ electrolyte are well-developed. Spectral response measurements of p-GaAs in aqueous $I^-/I^{3-}$, however, were complicated by the solubility of GaAs in the acidic $I^-/I^{3-}$ electrolyte.

No etching of p-GaAs was observed in the aqueous solution after hours of sustained operation as long as illumination was provided. However, a nA-range anodic current was observed in the aqueous solution when under dark or low-light conditions (<1 µW cm$^{-2}$). This was problematic for spectral response, (which uses a nA-range chopped light source) and impedance analysis, which is conducted in the dark (FIG. 6). Without being limited to a particular theory of operation, it is currently believed that the p-GaAs surface, while unstable in $H_2O$ especially at low pH, is cathodically stabilized by the photo-excited minority carrier electrons, causing it to act as a photo-gated battery. Thus, in some examples, a non-aqueous solution was used for the p-GaAs spectral response and impedance measurements. For example, NaI was used in some examples to provide $I^-$ rather than HI. The concentration of redox couple also was reduced to decrease parasitic light absorbance. The low-concentration of redox couple in non-aqueous solution was sufficient to support the nA-range signal and exhibited no photo-gated current (FIG. 6).

Figure 7:
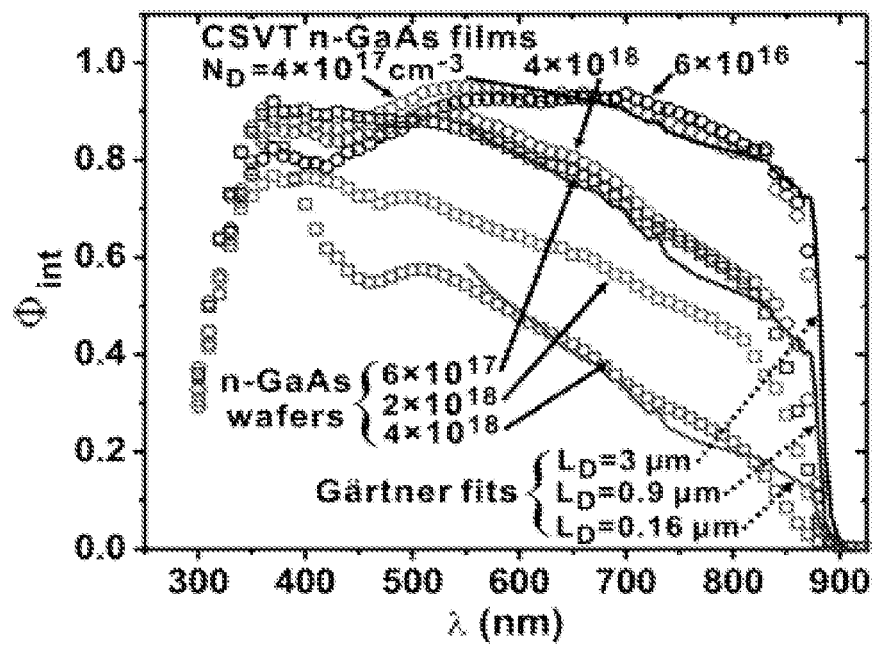
FIG. 7 is a graph illustrating $\phi_{int}$ measurements obtained using photoelectrochemical (PEC) analysis of n-GaAs thin films.
Figure 8:
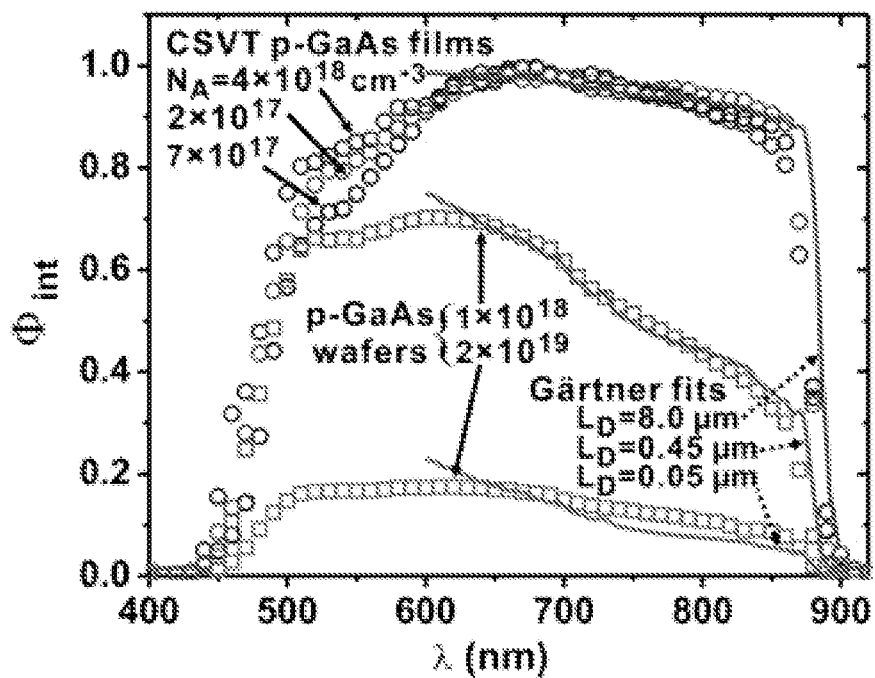
FIG. 8 is a graph illustrating $\phi_{int}$ measurements obtained using PEC on p-GaAs thin films.

Trends for both n and p-type GaAs in $J_{sc}$ were mirrored by the spectral response curves (FIGS. 7 and 8). Due to the wavelength dependence of $\alpha(\lambda)$, photons with energies near the band-gap $E_g$ are absorbed further from the surface than those with higher energies. Thus $\phi_{int}$ decays to zero at $E_g$. This can be modeled using the Gärtner equation, which assumes no depletion region recombination and that the $L_D$ governs bulk recombination:

$$\Phi_{int} = \left(1 - \frac{e^{-\alpha(\lambda)W}}{1 + \alpha(\lambda)L_D}\right) \quad (5)$$

where W is the width of the semiconductor depletion region. This approach produces reliable estimates of $L_D$ for GaAs and other semiconductors. Using this technique we measured three electrodes of each film.

One parameter fits to $\phi_{int}$ from eqn. (5) match the experimental data well (FIGS. 7 and 8). Moderately-doped n-GaAs CSVT films have $L_D$~2.9±0.2 µm, while CSVT p$^+$-GaAs thin films possess $L_D$=5.4±0.1 µm and moderately-doped p-GaAs thin films possess $L_D$=7.4±0.4 µm. The $L_D$ is higher in p-GaAs because $\mu_e$ is higher than $\mu_h$, which in turn is due to the curvature of the conduction and valence bands. For all CSVT samples, the measured $L_D$ was significantly higher than that of the control GaAs wafers ($L_D$=0.42 µm for n-GaAs:Te, 0.16 µm for n$^+$-GaAs:Si, 0.45 µm for p-GaAs:Zn, and 0.05 µm for p$^+$-GaAs:Zn) and consistent with one-sun $J_{sc}$ measurements.

Impedance Spectroscopy

Figure 9A:
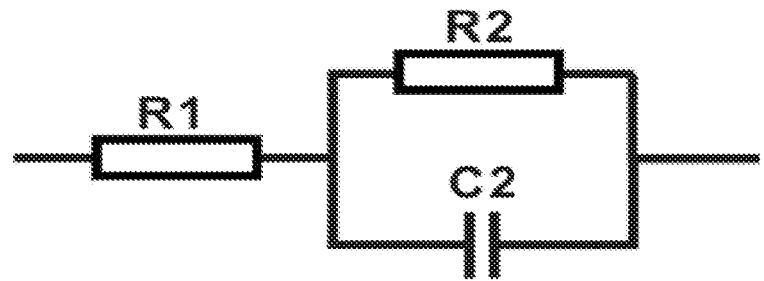
FIGS. 9A and 9B illustrate a circuit used to extract junction capacitance from electrochemical impedance measurements (FIG. 9A) and a graph illustrating total impedance and phase angle response to DC voltage wherein each curve represents a different DC bias.
Figure 9B:
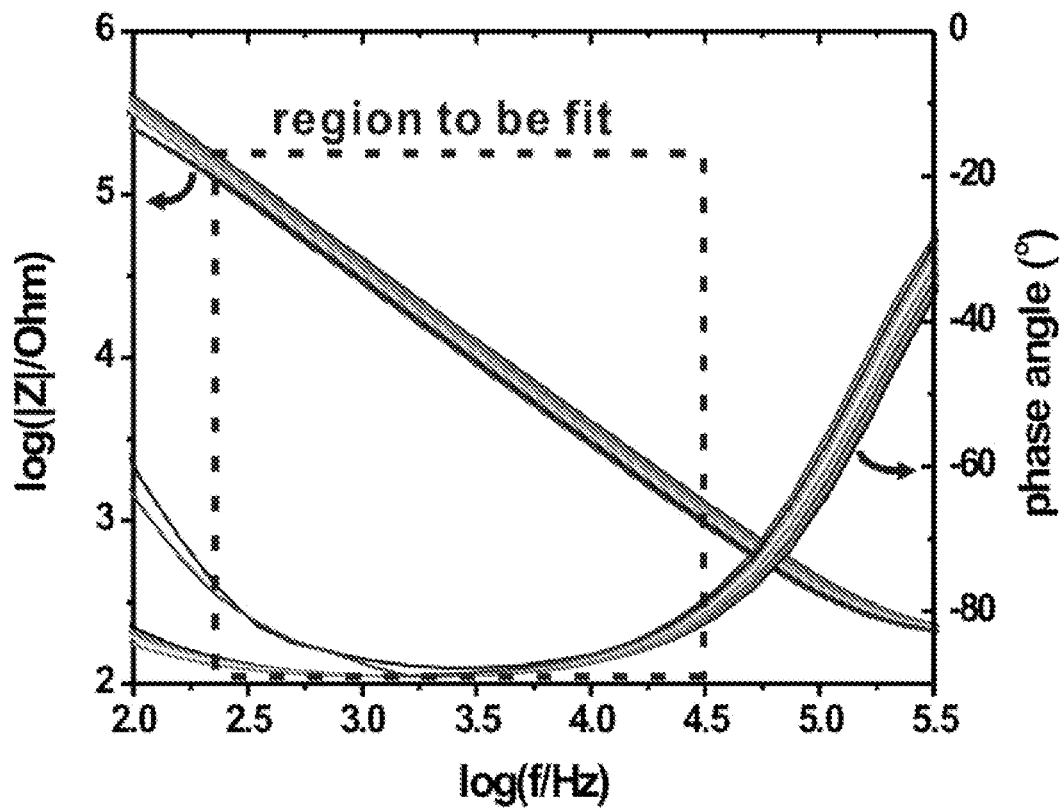
Figure 10A:
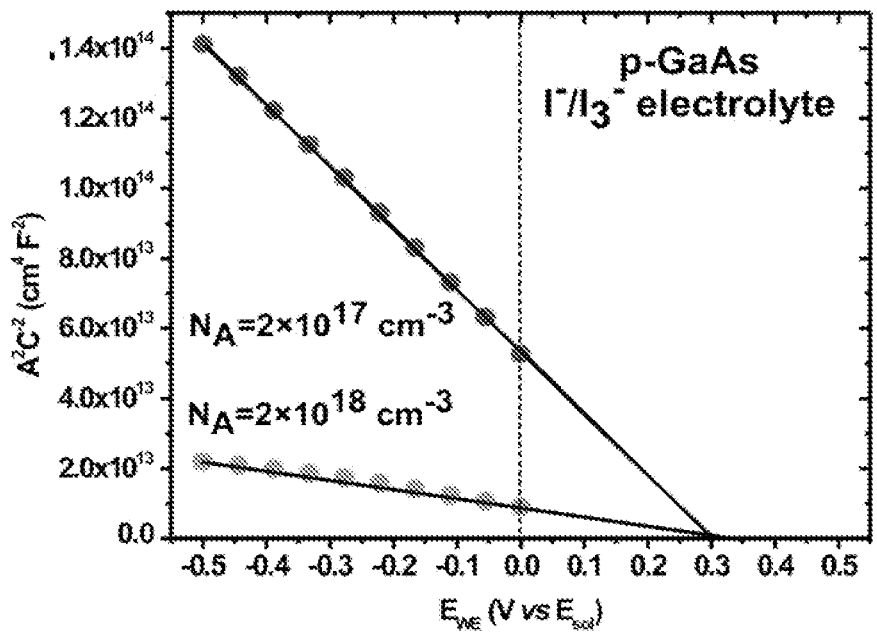
FIGS. 10A and 10B illustrate representative Mott-Schottky plots for a representative p-GaAs thin film (FIG. 10A) and a representative n-GaAs thin film (FIG. 10B).
Figure 10B:
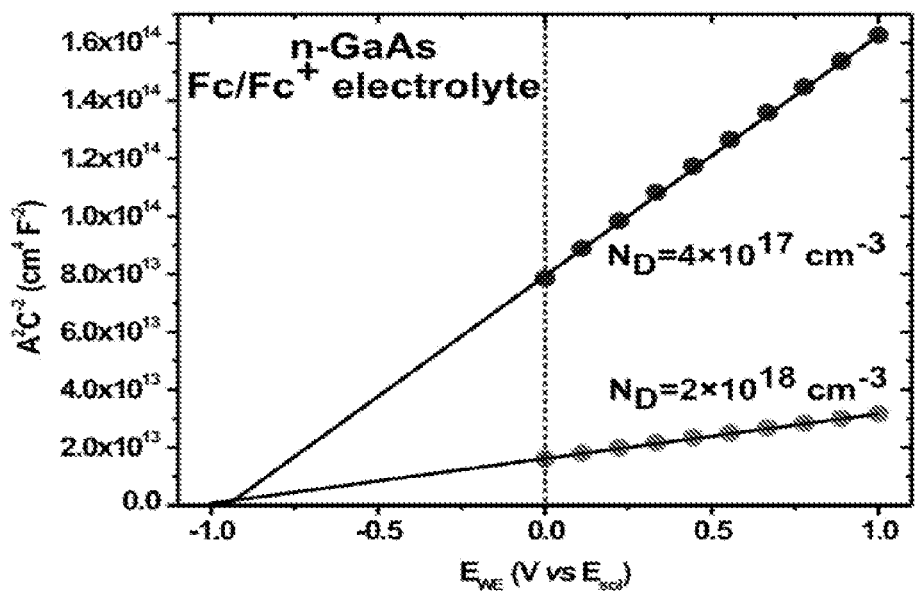

Impedance measurements were conducted with a potentiostat on GaAs electrodes in a dark box. n-Type GaAs electrodes were placed in the ferrocene/ferrocenium solution in the dark. The DC voltage of the GaAs sample was stepped from 0~1 V vs $E_{sol}$ in 10 steps. At each step the imaginary and real impedance were measured by applying a 10 mV AC bias superimposed on the DC bias. The AC frequency was swept from 500 kHz to 100 Hz in 10 steps. Data was selected from the region where the phase angle was less than −80°, indicating the measured impedance was primarily due to the GaAs depletion region capacitance (FIG. 9B). We fit the impedance vs voltage response to an equivalent circuit (FIG. 9A) using the Bio-Logic zFit utility in order to extract the capacitance-voltage response. Then we extracted the free carrier density ($N_D$ or $N_A$) and built-in voltage ($V_{bi}$) from Mott-Schottky plots (FIGS. 10A and 10B). The slope is proportional to the dopant density and the x-intercept is equal to $V_{bi}$. For GaAs in ferrocene/ferrocenium we extract $V_{bi}$~1 V. Measurements were conducted in a similar manner for p-type samples except for the following differences: p-GaAs was measured using the non-aqueous $I^-/I_3^-$ solution in acetonitrile, the DC voltage was stepped from E=0 to −0.5 V vs $E_{sol}$ in 10 steps, and the $V_{bi}$ was ~0.3 V. The impedance data were fit to the typical equivalent circuit model to extract the junction capacitance C (FIG. 9A). Mott-Schottky analysis was used to determine $N_D$ or $N_A$ and the barrier height $V_{bi}$ (FIGS. 10A and 10B).

$$\frac{1}{C^2} = \frac{2(V_{bi} - V_{app} - kT/q)}{q\varepsilon NA^2} \quad (1)$$

The depletion region thickness W was obtained using:

$$W = \sqrt{\frac{2\varepsilon}{qN}(V_{bi} - V_{app} - kT/q)} \quad (2)$$

where $\varepsilon$ is the dielectric constant of GaAs, q is the fundamental charge, $V_{app}$ is the applied bias, k is the Boltzman constant, and T is the temperature.

Hall Effect Measurements

GaAs thin films deposited on undoped semi-insulating (resistivity $\rho>10^7$ Ω·cm) substrates were cut into squares (0.49-0.64 cm$^2$) and ohmic contacts were applied to the corners. The carrier type, $\rho$, $N_A$ or $N_D$, and majority carrier mobility ($\mu_e$ or $\mu_h$ for electron or hole mobility, respectively) were obtained using the Van der Pauw method. Hall Effect measurements were conducted at 300 K on an Ecopia HMS-5000 Hall Effect system.

In some examples, films grown from a variety of p- and n-GaAs sources were deposited on undoped semi-insulating GaAs for Hall-Effect measurements. The data indicates that n-GaAs and p-GaAs thin films deposited using CSVT (from both powder and wafer sources) have similar $\mu_e$ and $\mu_h$ to films deposited using MOCVD (FIGS. 11 and 12, wherein values for the MOCVD embodiments were obtained from M. Sotoodeh et al., *J. Appl. Phys.*, 2000, 87, 2890-2900).

Figure 11:
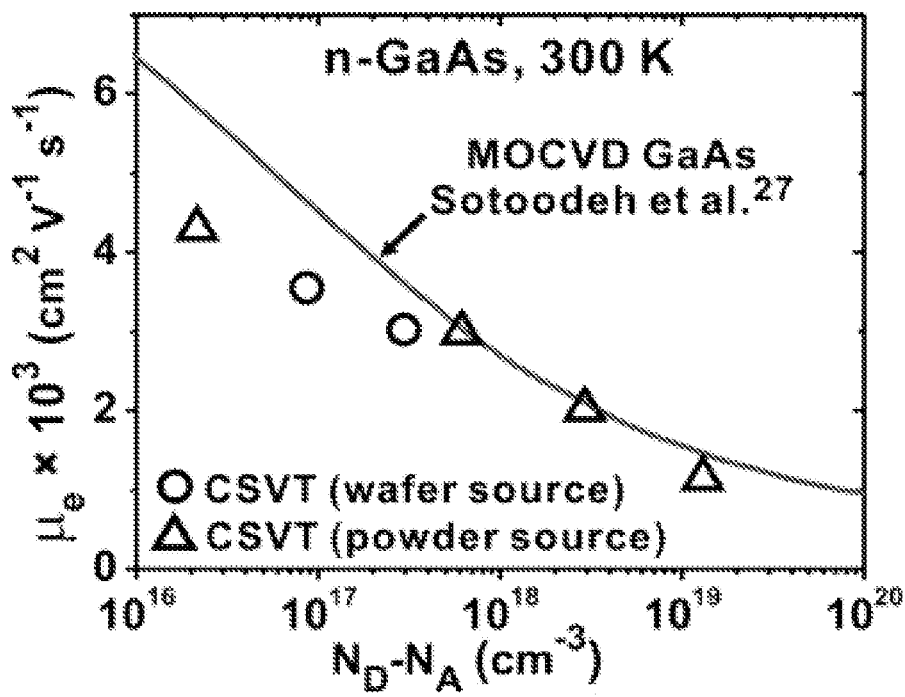
FIG. 11 is a graph of Hall mobilities of n-GaAs thin films made using an embodiment of the present disclosure as a function of $N_D$ and $N_A$, wherein solid curves represent the Hall mobility of high-quality epitaxially-grown GaAs films made using metal-organic chemical vapor deposition (MOCVD).
Figure 12:
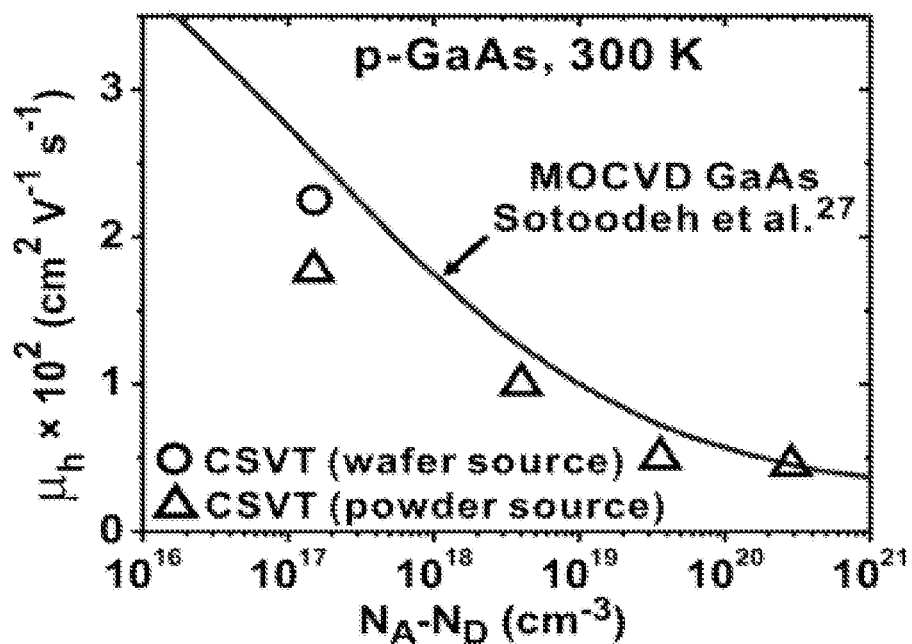
FIG. 12 is a graph of Hall mobilities of p-GaAs thin films made using an embodiment of the present disclosure as a function of $N_D$ and $N_A$, wherein solid curves represent the Hall mobility of high-quality epitaxially-grown GaAs films made using metal-organic chemical vapor deposition (MOCVD).

As $N_D$ and $N_A$ are increased, $\mu_e$ and $\mu_h$ decrease due to increased scattering from the ionized dopant atoms in the lattice (FIGS. 11 and 12). The measured $\mu_e$ and $\mu_h$ of CSVT GaAs thin films deviate from the MOCVD values more for lightly-doped samples than for highly-doped samples. This is likely because at lower $N_D/N_A$, the influence of trace compensating impurities and crystal defects becomes important relative to the dopant atom scattering. Overall, these results indicate that CSVT from GaAs powder sources is competitive with MOCVD in terms of the achievable $\mu_e$ and $\mu_h$ for a wide range of $N_D$ and $N_A$.

No significant differences were observed between films deposited from powder and wafer sources. This is because the growth takes place at the interface between substrate and the gas phase. Thus the source's crystalline quality should not affect the CSVT process as long as it does not affect the ability of the surface to be etched by $H_2O$ to produce vapor phase $As_2$ and $Ga_2O$. This implies that there is no need for crystalline powder sources, and lower quality powders could potentially be used as sources, for example those made by reaction of Ga and As at low temperatures.

Time-of-Flight Secondary Ion Mass Spectrometry

Figure 13A:
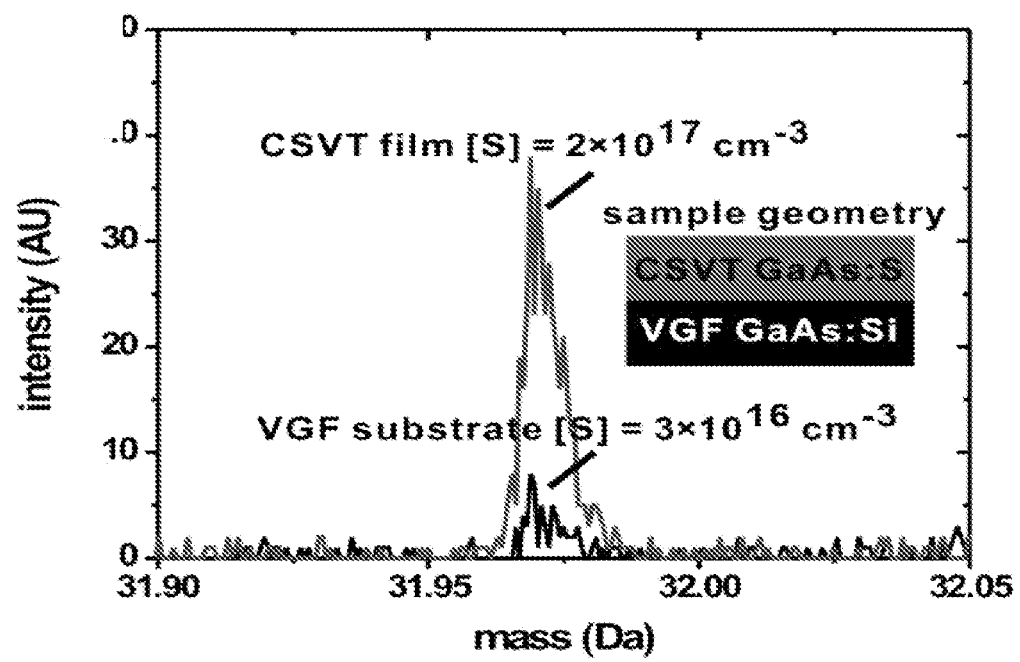
FIGS. 13A and 13B are mass spectra of the $^{32}$S region (FIG. 13A) and $^{28}$Si region (FIG. 13B) of a GaAs thin film deposited on a Si-doped n+-GaAs substrate.
Figure 13B:
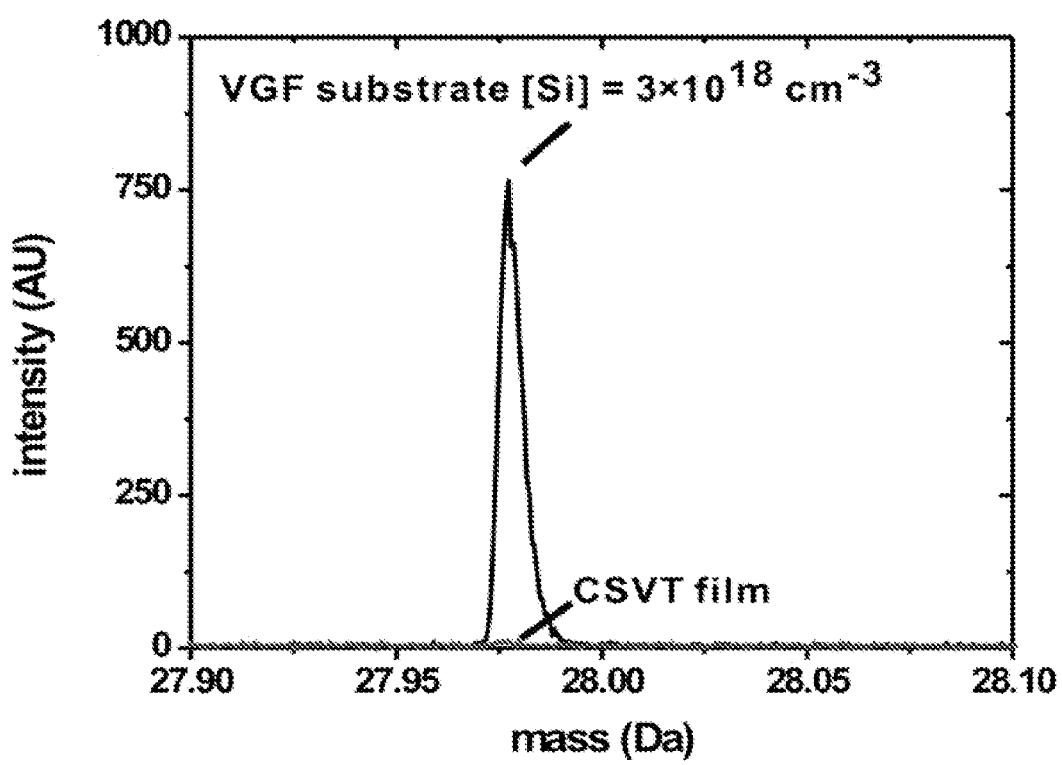

Mass spectra were obtained from a Cameca ION-TOF mass spectrometer with Cs$^+$ sputter gun and Bi$^+$ analysis gun. Ion counts were converted to bulk impurity concentrations using relative sensitivity factors (RSF).

$$[E] = RSF_E \times \frac{I_E}{I_M} \quad (3)$$

where [E] is the concentration of the element being analyzed in units of cm$^{-3}$, RSF$_E$ is the relative sensitivity factor of the element in the GaAs matrix, I$_E$ is the signal of the element of interest, and I$_M$ is the signal of the GaAs matrix (FIGS. 13A and 13B). Values for RSF were obtained from the literature. To confirm the validity of published RSF values with those obtained from embodiments disclosed herein, two ion implanted samples were measured (one $^{28}$Si-implanted and one $^{16}$O-implanted) and compared the obtained RSF values to the literature values. In both cases the values agreed to within +/−10%. TOF-SIMS also was used to measure the [Te] and [Si] of Te-doped and Si-doped GaAs wafers purchased from AXT.

TABLE 1

Dopant densities (measured by impedance analysis and Hall Effect) and impurity concentrations (determined by TOF-SIMS analysis) of several CSVT GaAs thin films deposited from powder and wafer sources.

| powder or wafer source | source dopant species (E) | source [E] (cm$^{-3}$)*$^a$ | Impedance analysis N$_D$ − N$_A$ (cm$^{-3}$) (average of three electrodes) | Hall Effect N$_D$ − N$_A$ (cm$^{-3}$) (one sample) | [E] from SIMS (cm$^{-3}$) (one sample) |
|---|---|---|---|---|---|
| wafer | Te | 2-4 × 10$^{18}$ | 3 × 10$^{18}$ ± 1 × 10$^{18}$ | — | 2 × 10$^{18}$ |
| powder | Te | 2-4 × 10$^{18}$ | 4 × 10$^{18}$ ± 1 × 10$^{18}$ | 3 × 10$^{18}$ | — |
| wafer | Te | 3-6 × 10$^{17}$ | 4 × 10$^{17}$ ± 4 × 10$^{16}$ | 3 × 10$^{17}$ | 6 × 10$^{17}$ |
| powder | Te | 3-6 × 10$^{17}$ | 7 × 10$^{17}$ ± 2 × 10$^{17}$ | 6 × 10$^{17}$ | — |
| powder | Zn | 5 × 10$^{21}$ | −2 × 10$^{19}$ ± 3 × 10$^{18}$ | −4 × 10$^{19}$ | — |
| powder | Zn | 5 × 10$^{20}$ | −4 × 10$^{18}$ ± 7 × 10$^{17}$ | −4 × 10$^{18}$ | — |
| wafer | Zn | 1-2 × 10$^{19}$ | −2 × 10$^{17}$ ± 1 × 10$^{16}$ | −1 × 10$^{17}$ | 1 × 10$^{17}$ |
| powder | S$^{\dagger b}$ | —$^{\dagger b}$ | 1 × 10$^{17}$ ± 4 × 10$^{16}$ | 2 × 10$^{16}$ | 3 × 10$^{16}$ |
| wafer | S$^{\dagger b}$ | —$^{\dagger b}$ | 7 × 10$^{16}$ ± 3 × 10$^{16}$ | 8 × 10$^{16}$ | 7 × 10$^{16}$ |

*$^a$for wafer sources the dopant density was provided by the manufacturer; for Zn-doped powder sources the dopant density was calculated from the mass of the GaAs powder and the Zn powder used.
$^{\dagger b}$the S dopant was not intentionally added.

Measured [Te] and [Si] agreed with both the vendor specifications and with No determined from impedance analysis. One CSVT-deposited p-GaAs thin film was sent to QSPEC for [Zn] determination on a magnetic sector SIMS, which possesses higher sensitivity to Zn than TOF-SIMS.

Electron Beam-Induced Current (EBIC)

The EBIC measurements were conducted in a scanning electron microscope (FEI Quanta 200F). The electron beam was scanned toward the Schottky contact and the resulting current transients (FIG. 14) were recorded from a Matelect ISM-6A induced signal monitor. L$_D$ was extracted from the decays according to:

$$I = qN_C e^{-x/L_D} \quad (4)$$

where the beam-induced current/is proportional to the exponential term, N$_C$ is the number of minority carriers generated by the excitation beam per second, and x is the separation between the excitation beam target and the Schottky junction. The Schottky contact pads were 50 μm gold squares patterned using photolithographic lift-off with a negative photoresist (AZ 5214E).

Figure 14:
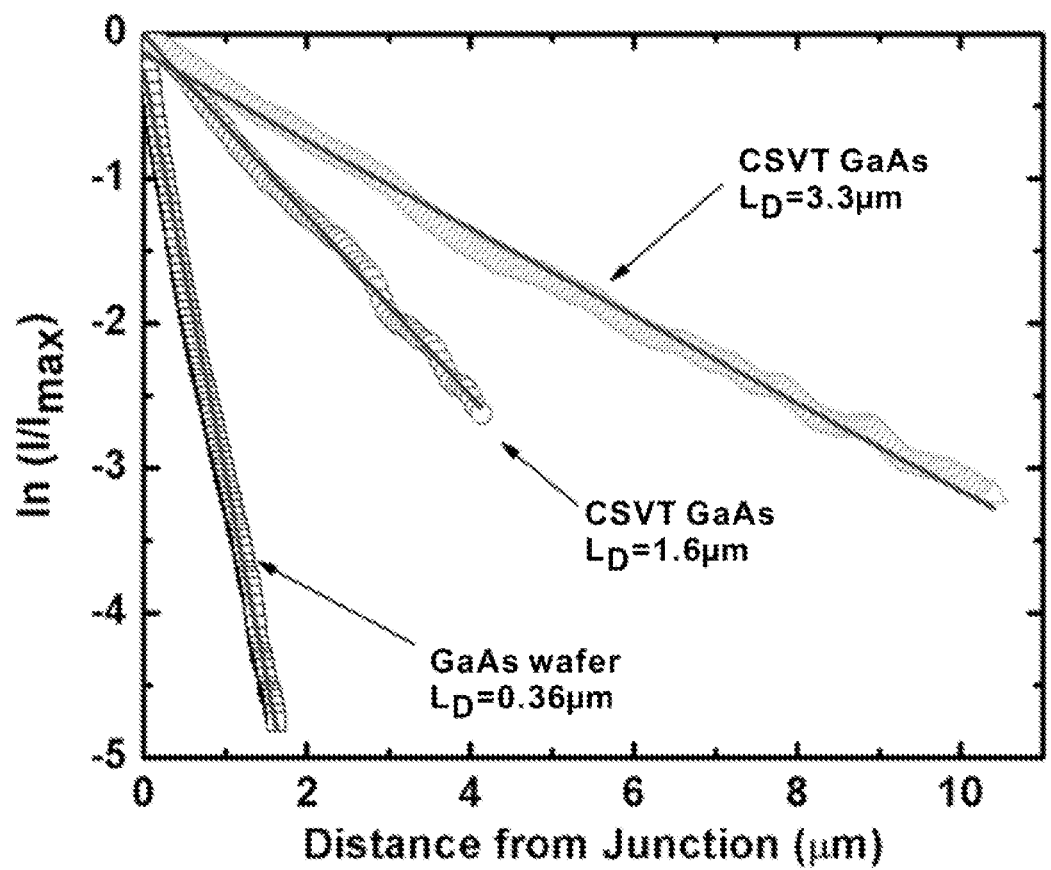
FIG. 14 is a graph of EBIC decays with linear fits used to extract $L_D$ values from passivated GaAs thin films measured with low accelerating voltages of 2-5 keV.

Prior to EBIC experiments, surface passivation was needed to lower the surface recombination velocity (SRV). Surface passivation was accomplished by etching with 5 M HCl, rinsing with 18.2 MΩ·cm water, immersing in aqueous 1M Na$_2$S, rinsing with water and ethanol, and drying with N$_2$. Samples were immediately pumped into the vacuum chamber and measured within 20 minutes after passivation. Results obtained without passivation varied as a function of accelerating voltage (V$_{acc}$) and did not produce reliable values of L$_D$. The signal decays used to extract L$_D$ fit eqn. (4) over several orders of magnitude of current (FIG. 14).

Because GaAs has a direct band gap and large α(λ), when L$_D$ exceeds several μm, the fraction of photons absorbed deeper than L$_D$ W is small, making determination of L$_D$ by the Gärtner model less precise.

Figure 15:
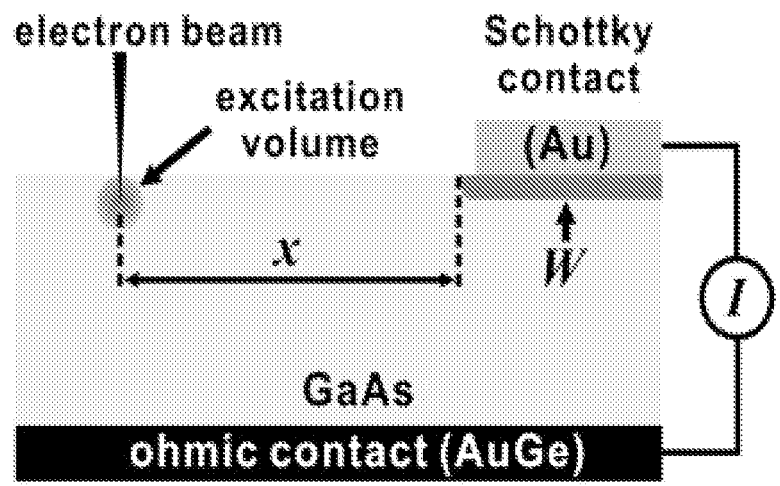
FIG. 15 is a schematic of an exemplary electron beam induced current (EBIC) technique, wherein X is the separation between the excitation source and the rectifying contact, I is the induced current, and W is the depletion region.

In EBIC analysis, the proximity of the excitation source to the charge separating junction is controlled by rastering an electron beam toward a Schottky contact (FIG. 15), and is thus independent of α(λ). The beam-induced current is measured as a function of the distance between the junction and the excitation source, and L$_D$ is determined by fitting the current decay according to eqn. (4).

Figure 16:
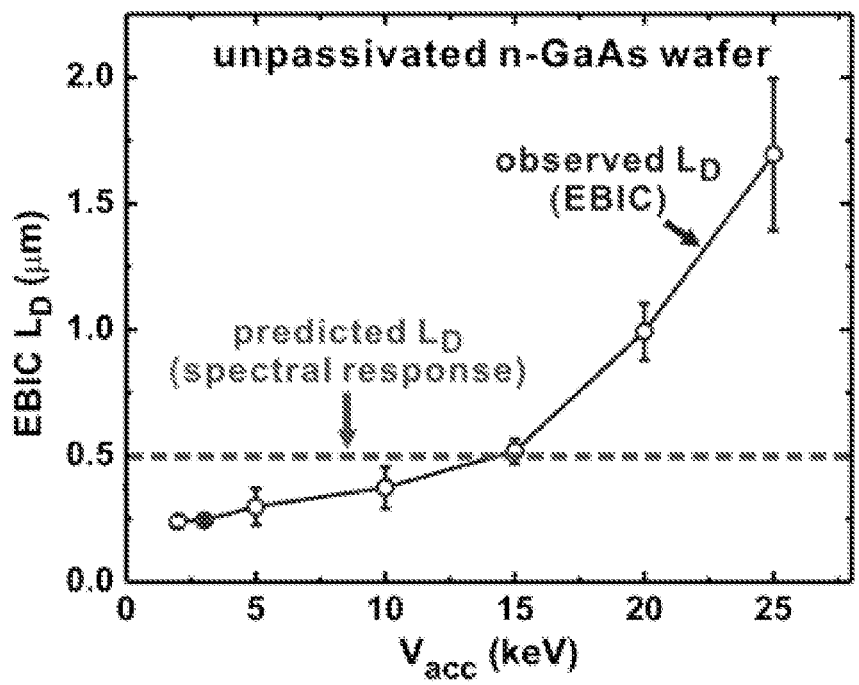
FIG. 16 is a graph of the observed EBIC decay constant as a function of $V_{acc}$, wherein the dashed line indicates $L_D$ predicted by spectral response using the Gärtner method; in this example, the sample was an unpassivated n-GaAs:Te wafer with $N_D=6\times10^{16}$ cm$^{-3}$.

After fabricating rectifying Au|n-GaAs junctions and measuring the EBIC response of the junctions, it was observed that the response was a function of V$_{acc}$ (FIG. 16), complicating accurate extraction of L$_D$.

In an ideal EBIC experiment, the excitation volume (which is proportional to V$_{acc}$) is small with respect to L$_D$ and the EBIC decay is dominated by bulk recombination with surface recombination playing a negligible role. These assumptions are invalid for unpassivated GaAs, which has a high SRV and a short L$_D$ relative to indirect absorbers like Si. Thus at low V$_{acc}$ the EBIC decay is dominated by surface recombination yielding erroneously low L$_D$, while at high V$_{acc}$ the excitation volume overlaps with the depletion region, yielding erroneously high L$_D$. In some examples using embodiments with unpassivated GaAs, the L$_D$ obtained from EBIC analysis coincidentally agreed with spectral response when V$_{acc}$=10-15 keV was used, which matches the V$_{acc}$ used in other studies.

Figure 17:
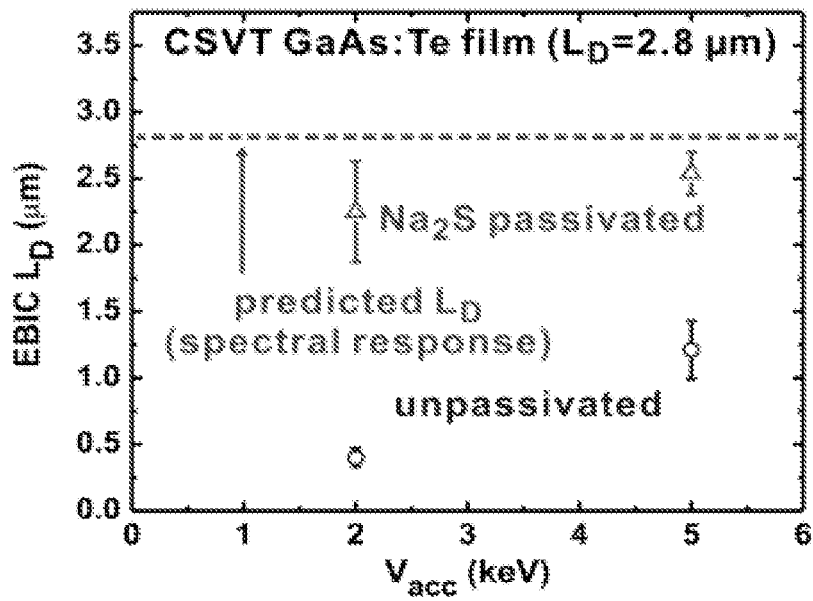
FIG. 17 is a graph of $L_D$ measured by EBIC on the same CSVT GaAs thin film before and after passivation by Na$_2$S, wherein the dashed line indicates the $L_D$ predicted by spectral response.
Figure 18:
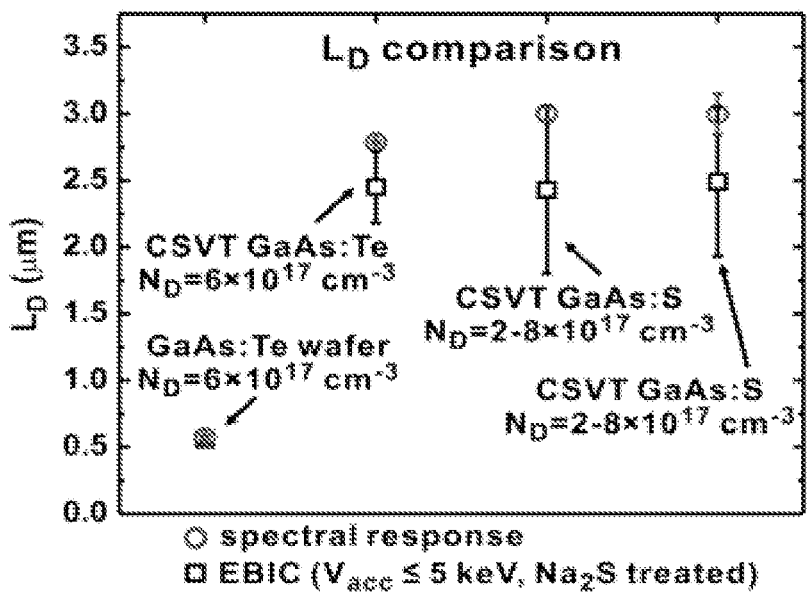
FIG. 18 is a graph comparing $L_D$ obtained by spectral response and EBIC techniques.

To obtain EBIC data which is accurately modeled by eqn. (4), Na$_2$S was used to passivate the GaAs surface thereby lowering the SRV. A low V$_{acc}$≤5 keV also was used to maintain a small interaction volume. After passivation, both spectral response and EBIC yielded similar values of L$_D$ for V$_{acc}$≤5 keV (FIG. 17). Comparing the two techniques, it was observed that there was more dispersion in the EBIC results (FIG. 18), but similar overall trends. Without being limited to a particular theory, it is currently believed that the EBIC and spectral response results differ because spectral response averages the current over a relatively large region (generally 0.05 cm$^2$), while EBIC measures the current decay of a line-scan and is therefore more sensitive to local recombination-inducing surface/bulk defects. Nonetheless, the direct measurement of $L_D$ by EBIC using Na$_2$S passivation confirms the long $L_D$ obtained from fitting PEC spectral response curves.

Pn Junction Device Fabrication

The CSVT process employing powdered GaAs and dopant sources allows for deposition of n$^+$ emitter layers onto p-type GaAs substrates or the sequential deposition of p-type and n-type layers to form electrically rectifying pn junctions with photovoltaic properties. In another configuration, the n-type film can be deposited first followed by the p$^+$ emitter film. The p and n-type films are deposited as epitaxial films onto crystalline GaAs wafers using the range of parameters indicated in the section above titled "GaAs thin film deposition."

After film growth, front contact grids were fabricated either by photolithography or evaporation of metal through a shadow mask. Fingers defined by photolithography were 20 µm wide, whereas the shadow mask had openings which were 50 µm wide. In an exemplary device containing an n$^+$ GaAs emitter layer, ohmic contact was made by sequentially evaporating Ni/AuGe with thicknesses of 20 nm/200 nm and annealing under forming gas at 450° C. for 2 minutes. Individual mesas were then patterned in photoresist, and the GaAs was etched by citric acid/hydrogen peroxide for 20-30 minutes. The photoresist was subsequently removed with acetone leaving GaAs mesas 10 µm in height. Back contacts were formed by applying InGa eutectic with a diamond-tipped scribe. Each film contained up to 10 individual 0.2 mm square mesas, depending on the size of the substrate.

TABLE 2

Films grown and fabricated into solid-state solar cells

| Film Number | $T_{src}$ (° C.) | $T_{sub}$ (° C.) | Source Doping (cm$^{-3}$) | Substrate (cm$^{-3}$) | Note |
|---|---|---|---|---|---|
| 1 | 850 | 830 | Te 1 × 10$^{18}$ | Zn 1 × 10$^{18}$ | |
| 2 | 850 | 830 | Te 1 × 10$^{18}$ | Zn 1 × 10$^{18}$ | |
| 3 | 850 | 830 | Te 1 × 10$^{18}$ | Zn 1 × 10$^{18}$ | |
| 4 | 845 | 830 | Te 1 × 10$^{18}$ | Zn 1 × 10$^{18}$ | |
| 5 | 850 | 830 | Te 1 × 10$^{18}$ | Zn 1 × 10$^{18}$ | |
| 6 | 850 | 830 | Te 1 × 10$^{19}$ | Zn 1 × 10$^{17}$ | |
| 7 | 850 | 830 | Te 1 × 10$^{19}$ | Zn 1 × 10$^{17}$ | Etched substrate |
| 8 | 850 | 830 | Ge 1 × 10$^{19}$ | Zn 1 × 10$^{17}$ | |
| 9 | 850 | 830 | Ge 1 × 10$^{19}$ | Zn 1 × 10$^{17}$ | On etched CSVT film |
| 10 | 760 | 720 | Te 1 × 10$^{19}$ | Zn 1 × 10$^{17}$ | |
| 11 | 780 | 720 | Te 1 × 10$^{19}$ | Zn 1 × 10$^{17}$ | |
| 12 | 800 | 740 | Te 1 × 10$^{19}$ | Zn 1 × 10$^{17}$ | |
| 13 | 820 | 760 | Te 1 × 10$^{19}$ | Zn 1 × 10$^{17}$ | |

The indicated substrates were etched for 30 seconds in a 10:1:0.5 H2O:NH4OH:H2O2 solution and blown dry before growth. All films were grown with a source temperature of 850° C.

Device Characterization

Current-voltage (IV) curves were measured using a Keithley 2400 source meter. Illuminated curves were measured under AM1.5G simulated spectrum. Films 1-5 gave very similar average IV characteristics, as shown in Table 3. The variation in these parameters is largely due to the varying emitter thickness (200-300 nm as measured by a stylus and optical profilometry), which is influenced by the temperature gradient and source/substrate spacing. Transmission line measurements (TLM) on some of the films yielded resistivities of 0.005-0.007 Ω·cm, which corresponds to a carrier concentration of 2-3×10$^{17}$ cm$^{-3}$ for uncompensated n-GaAs.

Figure 22:
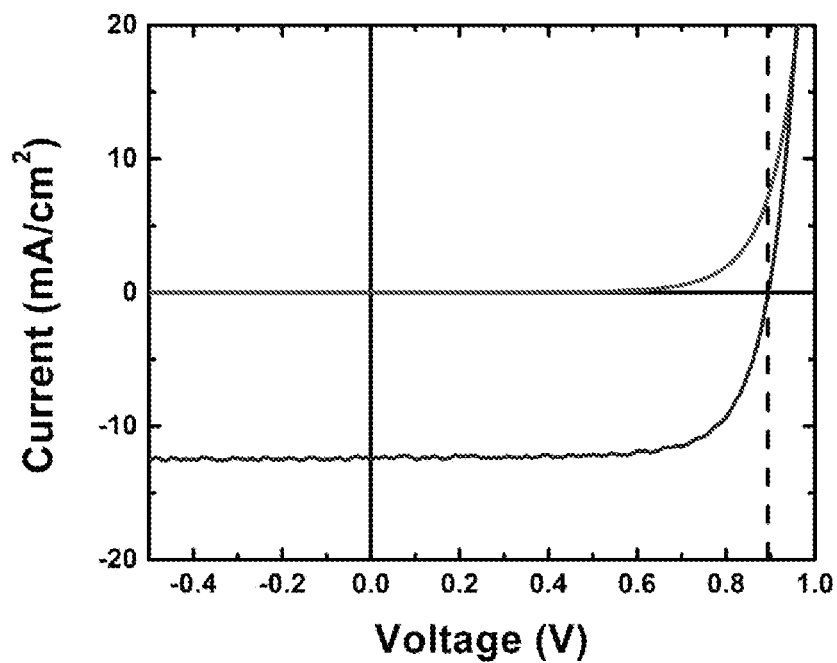
FIG. 22 is a graph of light and dark IV curves for a device formed from a pn junction GaAs thin film.

Since this is lower than the source doping, it suggests that the films may be compensated by Zn diffusion from the substrates (which are doped 1×10$^{18}$ cm$^{-3}$ for these films). An exemplary current voltage curve collected from a device based on film 12 is shown in FIG. 22.

TABLE 3

Average IV characteristics for devices fabricated from films 1-5

| | Average Value | σ |
|---|---|---|
| $V_{oc}$ | 490 mV | 40 mV |
| $J_{sc}$ | 7.8 mA/cm$^2$ | 0.65 mA/cm$^2$ |
| Efficiency | 2.36% | 0.20% |
| Fill Factor | 62% | 2.2% |

Figure 19:
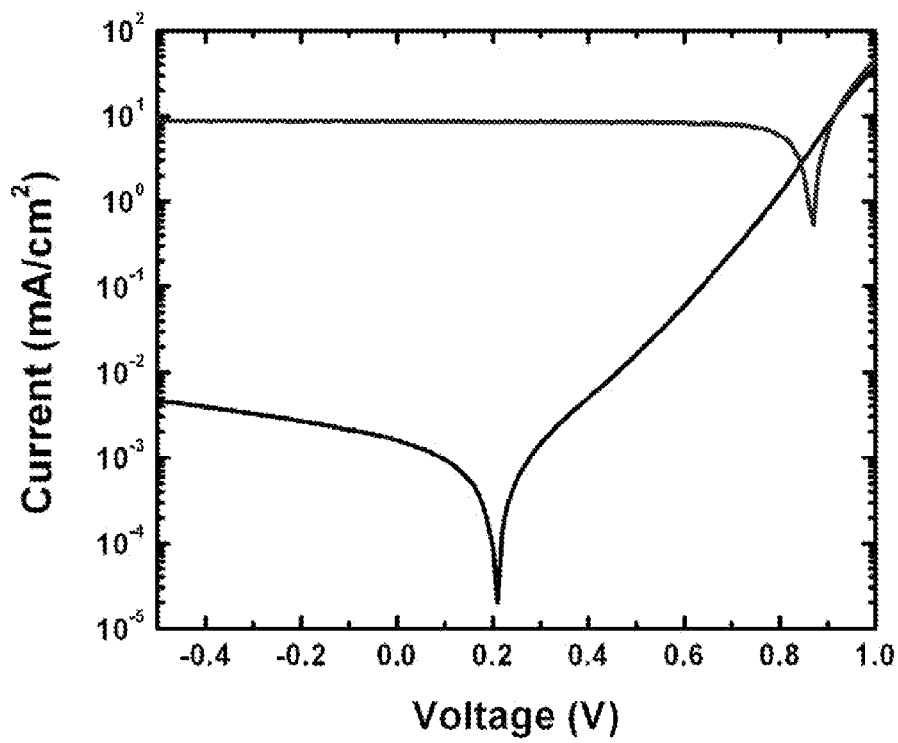
FIG. 19 is a graph of current as a function of voltage illustrating results obtained from of a representative GaAs pn junction thin film device.

Since the IV characteristics were very similar, films 6-13 were grown with much larger changes in the growth parameters including the use of both a different source and deposition substrate. A lower p-type doping level for the substrate was expected to improve the emitter quality by minimizing diffusion of Zn. One Ge-doped emitter was grown on a Zn-doped CSVT film with a known diffusion length>5 µm (film 9). The IV parameters from these devices are shown in Table 4. A minimum of 5 devices were averaged for each film. Up to 2 outlier devices were removed from each film, which were typically devices at the very edge with contacts shunted to the substrate. The front contact for all of these devices was ohmic without annealing, suggesting the carrier concentration was high. TLM data was inconclusive due to film inhomogeneities. FIG. 19 provides results obtained from analysis of an exemplary device made using film 7.

TABLE 4

IV characteristics of devices fabricated with films 6-13

| Film | $V_{oc}$ (mV) | $J_{sc}$ (mA/cm$^2$) | Eff. (%) | FF (%) |
|---|---|---|---|---|
| 6 | 846 ± 44 | 7.9 ± 0.6 | 4.8 ± 0.7 | 72 ± 7 |
| 7 | 872 ± 8 | 8.5 ± 0.4 | 5.5 ± 0.1 | 75 ± 2 |
| 8 | 402 ± 91 | 5.7 ± 0.6 | 1.3 ± 0.2 | 60 ± 8 |
| 9 | 320 ± 153 | 6.9 ± 1.3 | 1.1 ± 0.6 | 46 ± 7 |
| 10 | 834 ± 42 | 12.3 ± 0.2 | 7.1 ± 0.7 | 69 ± 4 |
| 11 | 868 ± 35 | 8.3 ± 0.8 | 4.8 ± 1.9 | 64 ± 23 |
| 12 | 863 ± 35 | 11.9 ± 0.5 | 7.6 ± 0.4 | 74 ± 2 |
| 13 | 783 ± 20 | 10.7 ± 0.8 | 5.7 ± 0.4 | 68 ± 1 |

Figure 20:
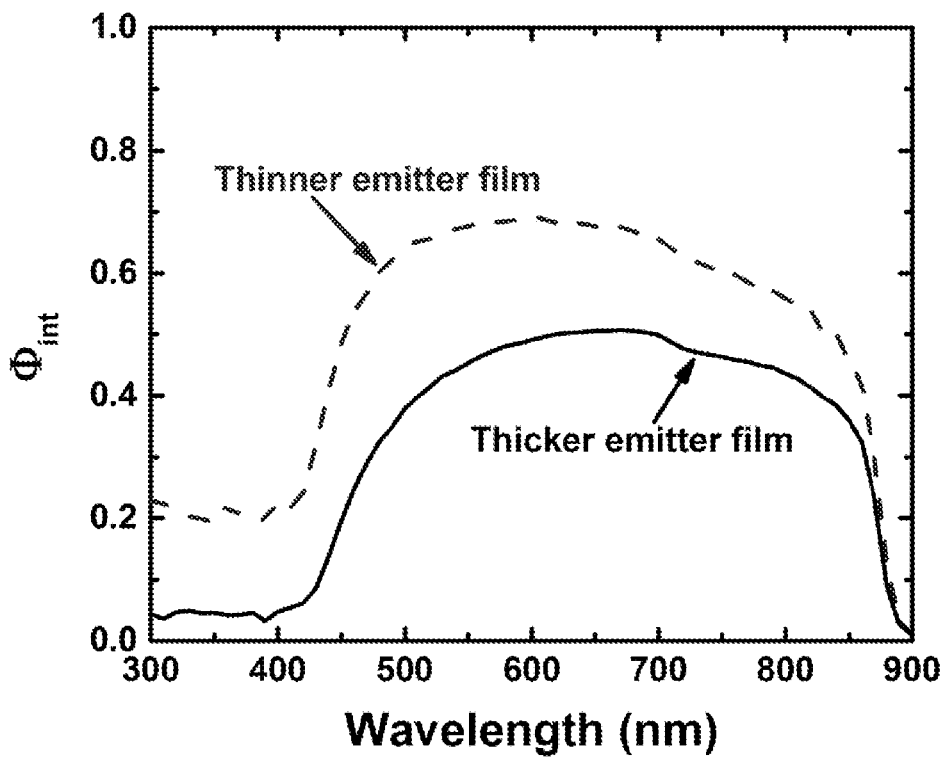
FIG. 20 is a graph of internal quantum efficiency ($\phi_{int}$) as a function of wavelength illustrating results obtained from analysis of representative pn junction GaAs film devices having different thicknesses, wherein the GaAs films were fabricated using close-spaced vapor transport.

A few devices were chosen from each film for quantum efficiency measurements. FIG. 20 shows typical internal quantum efficiency curves ($\phi_{int}$) for films 6 and 12, which are calculated from the external quantum efficiency by using the known reflectance of planar GaAs and accounting for grid shading. The thickness of film 6 is around 300 nm, which is much larger than optimal since a large fraction of the light is absorbed before reaching the junction. In contrast, film 12 has an emitter only ~100 nm thick and shows an improvement in $\phi_{int}$ for all devices measured, particularly for short wavelengths. Passivation with Na$_2$S on film 6 yielded only marginal improvement in response below 450 nm. This suggests that the hole diffusion length in the emitter, and not surface recombination, is the present limitation to photocurrent in that wavelength region.

Figure 21:
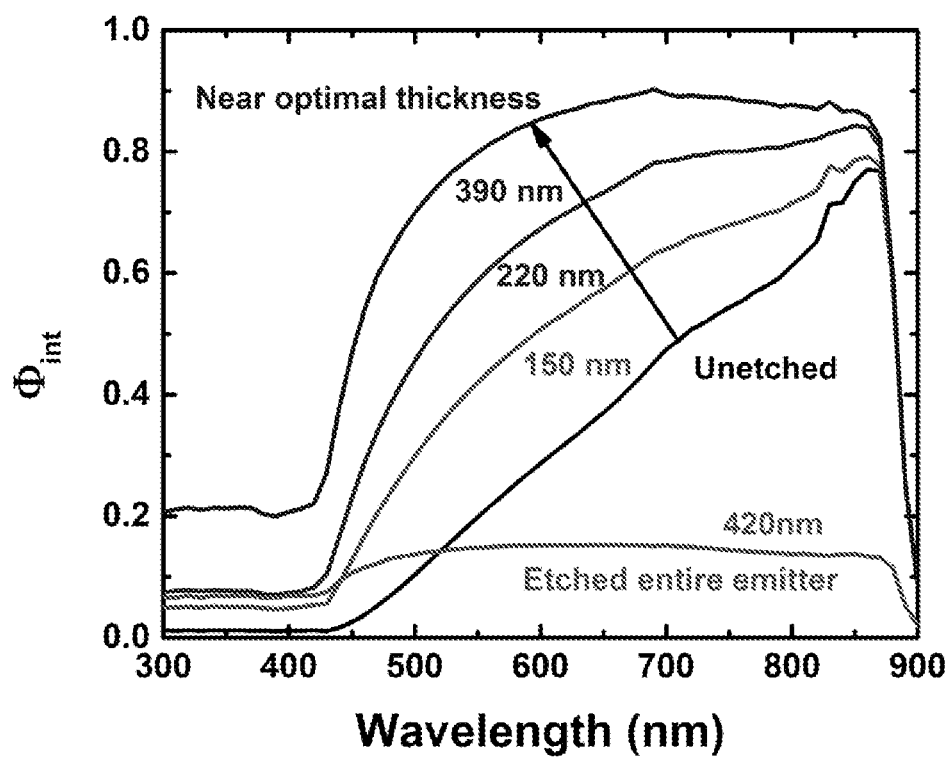
FIG. 21 is graph of internal quantum efficiency at various etch depths for a representative pn junction GaAs thin film device illustrating that response improves with thinning of the emitter and wherein the "390 nm," "220 nm," "150 nm," and "420 nm" labels indicate the depth etched on the emitter.

The Ge-doped emitters had lower efficiencies than those doped by Te. However, the peak $\phi_{int}$ was actually much higher for the Ge emitter grown on a CSVT absorber, which is expected given the CSVT absorber material typically has a much longer electron diffusion length than the wafer substrates. Since this emitter thickness was also >300 nm, one of its devices was etched in a solution of $H_2O$, $NH_4OH$, and $H_2O_2$ in a ratio of 90:10:0.25 to observe (Omit as a function of emitter thickness (FIG. 21). Etch rate was measured by optical profilometry on bare GaAs wafers and was approximately 5 Å/s.

Figure 23:
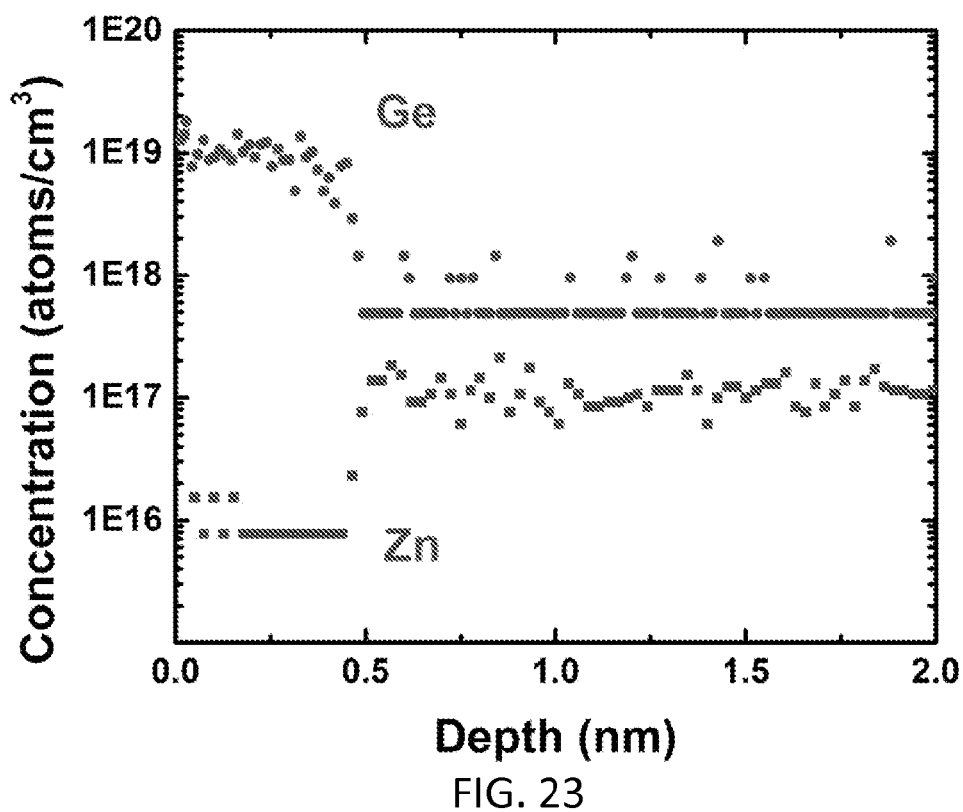
FIG. 23 is a graph of concentration as a function of depth illustrating a SIMS profile of Ge and Zn measured on a pn junction GaAs thin film device which shows an abrupt junction.
Figure 24:
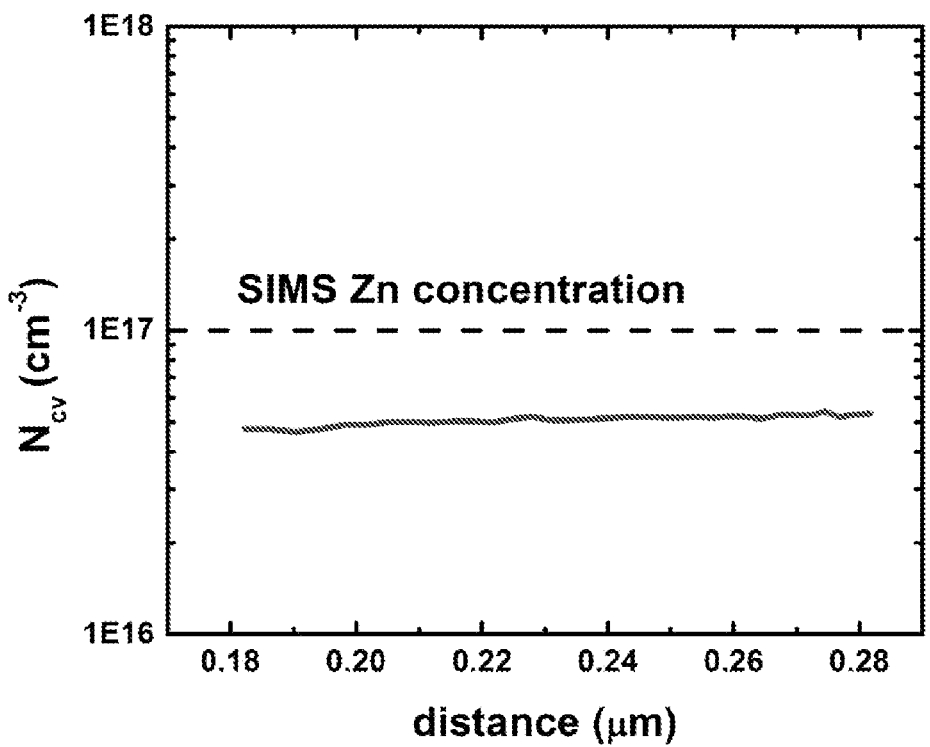
FIG. 24 is a graph of carrier concentration determined by capacitance-voltage profiling of a pn junction GaAs thin film device from which the level of compensation can be deduced.

A portion of film 9 was sent to Qspec Technology, Inc. for measurement of Zn and Ge concentrations using magnetic sector secondary ion mass spectrometry (SIMS). The SIMS profile (FIG. 23) shows that both Zn and Ge drop below the detection limit over a depth of ~100 nm. A capacitance-voltage profile for a device on this film is shown in FIG. 24. The active carrier concentration of $4 \times 10^{16}$ cm$^{-3}$ compared to the SIMS Zn concentration suggests that the p-type film is compensated by n-type dopants to $6 \times 10^{16}$ cm$^{-3}$. This is consistent with the known sulfur background for this reactor measured by time-of-flight SIMS on a number of previously grown GaAs films.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A method comprising:
    forming a GaAs thin film on a deposition substrate by the steps of
    providing a GaAs powder source;
    providing a dopant source; and
    using vapor transport with a chemical transport agent to deposit the GaAs thin film on the deposition substrate, the GaAs thin film having Hall mobilities of 1000-4200 cm$^2$V$^{-1}$s$^{-1}$ for an n-type GaAs thin film and/or 50-240 cm$^2$V$^{-1}$s$^{-1}$ for a p-type GaAs thin film.

2. The method of claim 1, wherein the GaAs thin film is epitaxial.

3. The method of claim 1, wherein the dopant source is selected from S, Se, Cd, Ge, Si, C, Te, Zn, or combinations thereof.

4. The method of claim 1, wherein the chemical transport agent is selected from $H_2$, $H_2O$, $I_2$, HCl, or combinations thereof.

5. The method of claim 1, wherein the vapor transport comprises aqueous vapor transport.

6. A method comprising:
    providing a doped GaAs powder source;
    depositing a GaAs thin film on a deposition substrate from the doped GaAs powder source using a chemical transport agent in a vapor transport apparatus, the chemical transport agent comprising a carrier gas and $H_2O$, the $H_2O$ concentration being 10 ppm to 12,000 ppm during the deposition; and
    wherein the GaAs thin film is capable of producing a photocurrent ranging from 15 mA cm$^{-2}$ to 25 mA cm$^{-2}$ under 100 mW cm$^{-2}$ AM 1.5G illumination.

7. The method of claim 6, wherein the doped GaAs powder comprises S, Se, Cd, Ge, Si, C, Te, Zn, or combinations thereof.

8. The method of claim 6, wherein the GaAs thin film comprises a dopant concentration ranging from $10^{16}$ cm$^{-3}$ to $10^{19}$ cm$^{-3}$.

9. The method of claim 6, wherein the GaAs thin film is epitaxial.

10. A method comprising:
    combining a solid GaAs powder with a dopant to form a source composition;
    depositing a GaAs thin film on a deposition substrate, from the source composition, using a chemical transport agent in a vapor transport system, in the absence of a toxic gas; and
    wherein the GaAs thin film has an $L_D$ value of 2 μm to 3 μm or 5 μm to 8 μm.

11. The method of claim 10, wherein the dopant is selected from S, Se, Cd, Ge, Si, C, Te, Zn, or combinations thereof.

12. The method of claim 10, wherein the chemical transport agent is selected from $H_2$, $H_2O$, $I_2$, HCl, and combinations thereof.

13. A method comprising making a GaAs thin film on a deposition substrate using a close-spaced vapor transport system, by:
    providing a source composition comprising GaAs and a dopant powder mixture;
    maintaining a heat source positioned proximate the source composition, at a temperature ranging from 600° C. to 950° C.;
    providing the deposition substrate positioned from 0.5 mm to 1.5 mm from the source composition;
    maintaining the deposition substrate at a temperature that is 5° C. to 200° C. lower than the temperature of the heat source thereby producing a thermal gradient between the source composition and the deposition substrate;
    exposing the source composition to a chemical transport agent in the close-spaced vapor transport system to produce a vapor-phase GaAs precursor composition; and
    depositing the GaAs thin film on the deposition substrate using the thermal gradient to facilitate deposition of the vapor-phase GaAs precursor composition.

14. The method of claim 13, wherein the GaAs thin film is an epitaxial film.

15. The method of claim 13, wherein the GaAs thin film is a polycrystalline film.

16. The method of claim 13, wherein the source composition is exposed to the chemical transport agent at atmospheric pressure.

17. The method of claim 13, wherein the chemical transport agent is selected from $H_2$, $H_2O$, $I_2$, HCl, and combinations thereof.

18. The method of claim 13, wherein the chemical transport agent is $H_2$ and $H_2O$.

19. The method of claim 13, wherein the GaAs thin film is deposited on the deposition substrate at a rate of 10 nm per minute to 10 μm per minute.

20. The method of claim 13, wherein the dopant is selected from S, Se, Cd, Ge, Si, C, Te, Zn, or combinations thereof.

21. The method of claim 13, wherein the dopant is Te powder and/or Zn powder.

22. The method of claim 13, wherein the GaAs thin film comprises a dopant concentration ranging from $10^{16}$ cm$^{-3}$ to $10^{19}$ cm$^{-3}$.

* * * * *